(12) United States Patent
Vali et al.

(10) Patent No.: US 9,430,735 B1
(45) Date of Patent: Aug. 30, 2016

(54) NEURAL NETWORK IN A MEMORY DEVICE

(71) Applicant: Micron Technology, Inc., Boise, ID (US)

(72) Inventors: Tommaso Vali, Sezze (IT); Kenneth J. Eldredge, Boise, ID (US); Frankie F. Roohparvar, Monte Sereno, CA (US); Luca De Santis, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 381 days.

(21) Appl. No.: 13/774,553

(22) Filed: Feb. 22, 2013

Related U.S. Application Data

(60) Provisional application No. 61/602,344, filed on Feb. 23, 2012.

(51) Int. Cl.
*G06F 15/00* (2006.01)
*G06F 15/18* (2006.01)
*G06N 3/04* (2006.01)

(52) U.S. Cl.
CPC ...................................... *G06N 3/04* (2013.01)

(58) Field of Classification Search
CPC ...... G06K 9/6282; G06K 9/68; G06F 15/00; G05F 15/18
See application file for complete search history.

(56) References Cited

U.S. PATENT DOCUMENTS

| | | | |
|---|---|---|---|
| 5,675,668 A * | 10/1997 | Yoneda | G06K 9/68 382/233 |
| 8,332,578 B2 * | 12/2012 | Frickey et al. | 711/103 |
| 2010/0228911 A1 * | 9/2010 | Sasao | 711/108 |
| 2011/0307433 A1 | 12/2011 | Dlugosch | |
| 2011/0307503 A1 | 12/2011 | Dlugosch | |

OTHER PUBLICATIONS

'Analog VLSI implementation of neural systems': Mead, 1989, Kluwer, 'A neural processor for maze solving': Carroll, pp. 1-26.*
'Elements of artificial neural networks', Mehrotra, 1997, MIT press.*
'Stuttgart neural network simulator': Zell, 1995, University of Stuttgart.*

* cited by examiner

*Primary Examiner* — Kakali Chaki
*Assistant Examiner* — Peter Coughlan
(74) *Attorney, Agent, or Firm* — Dicke, Billig & Czaja, PLLC

(57) ABSTRACT

Devices, systems and methods for operating a memory device facilitating a neural network in a memory device are disclosed. In at least one embodiment, the memory device is operated having a feed-ward neural network operating scheme. In at least one other embodiment, memory cells are operated to emulate a number of neural models to facilitate one or more neural network operating characteristics in the memory device.

67 Claims, 15 Drawing Sheets

NEURAL NETWORK IN A MEMORY DEVICE

RELATED APPLICATION

This application is a non-provisional application of provisional application U.S. 61/602,344, filed Feb. 23, 2012, and titled "NEURAL NETWORK IN A MEMORY DEVICE," related to provisional application U.S. Ser. No. 61/476,574, filed Apr. 18, 2011, titled "METHODS AND APPARATUS FOR PATTERN MATCHING" which is commonly assigned.

TECHNICAL FIELD

The present disclosure relates generally to memory and in particular, in one or more embodiments, the present disclosure relates to methods and apparatus for facilitating neural network operations in a memory device.

BACKGROUND

Memory devices are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Flash memory devices are commonly used in electronic systems, such as personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as digit (e.g., bit) lines. In NAND flash architecture, a column of memory cells is coupled in series with only the first memory cell of the column coupled to a bit line.

Neural networks are networks which process information by modeling a network of neurons, such as neurons in a human brain, to process information (e.g., stimuli) which has been sensed in a particular environment. Similar to a human brain, neural networks typically comprise multiple neuron models to process information. The demand for improved operating characteristics of neural networks continues to increase. Such desirable neural network operating characteristics improvements are increased speed, capacity and processing power of neural networks, for example.

For the reasons stated above, and for other reasons stated below which will become apparent to those skilled in the art upon reading and understanding the present specification, there is a need in the art for methods and devices for improving operating characteristics of neural networks.

DETAILED DESCRIPTION

Figure 1:
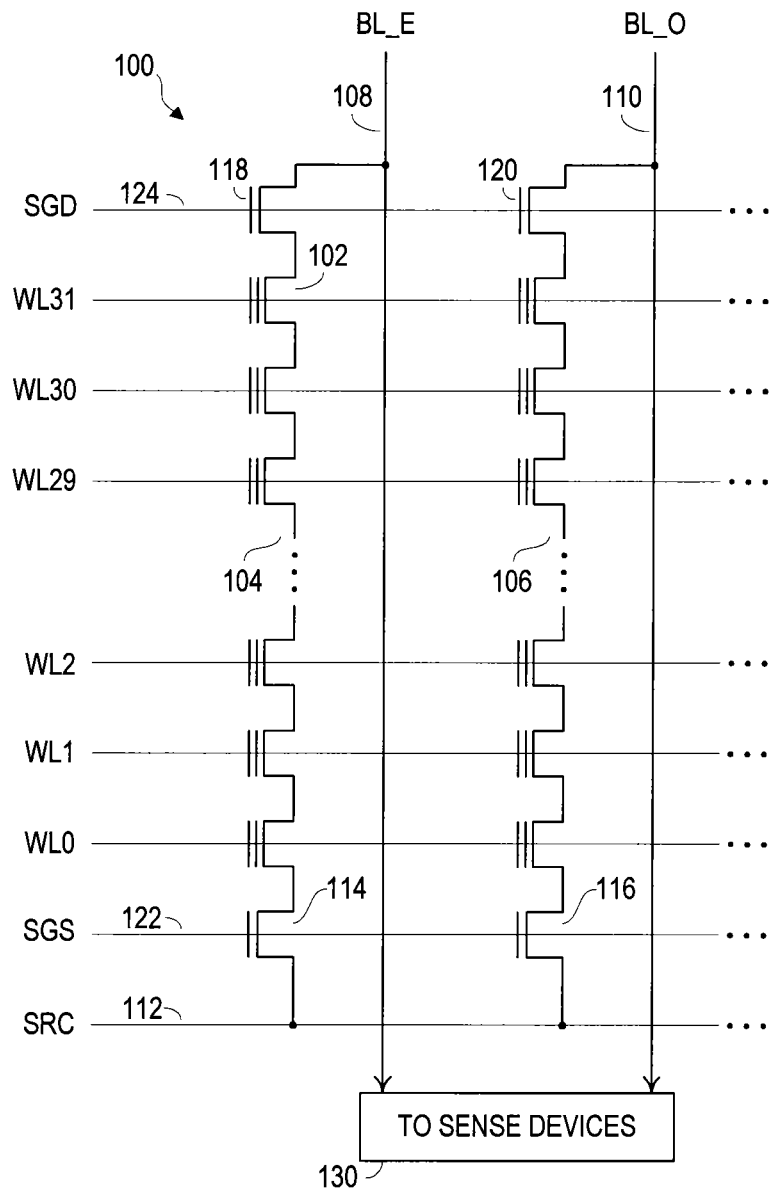
FIG. 1 illustrates a schematic representation of an array of NAND configured memory cells.

In the following detailed description of the invention, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The memory array 100 shown in FIG. 1 comprises an array of non-volatile memory cells 102 (e.g., floating gate memory cells) arranged in columns such as series strings 104, 106. Each of the cells is coupled drain to source in each series string 104, 106. An access line (e.g., word line) WL0-WL31 that spans across multiple series strings 104, 106 is coupled to the control gates of each memory cell in a row in order to bias the control gates of the memory cells in the row. Data lines, such as even/odd bit lines BL_E 108, BL_O 110, are coupled to the series strings and eventually coupled to sense circuitry 130 which typically comprise sense devices (e.g., sense amplifiers) that detect the state of each cell by sensing current or voltage on a selected bit line. The bit lines BL_E 108, BL_O 110 are also coupled to page buffers (not shown) which may comprise one or more latches and can be programmed with data from each selected word line, for example. The sense circuitry and page buffers may be part of the same circuitry or the page buffers can be separate circuitry.

Each series string 104, 106 of memory cells is coupled to a source 112 by a source select gate 114, 116 (e.g., transistor) and to an individual even or odd bit line BL_E, BL_O by a drain select gate 118, 120 (e.g., transistor). The source select gates 114, 116 are controlled by a source select gate control line SGS 122 coupled to their control gates. The drain select gates 118, 120 are controlled by a drain select gate control line SGD 124.

In a typical programming of the memory array 100, each memory cell is individually programmed as either a single level cell (SLC) or a multiple level cell (MLC). The cell's threshold voltage ($V_t$) can be used as an indication of the data stored in the cell. For example, in an SLC, a $V_t$ of 2.5V might indicate a first data state while a $V_t$ of −0.5V might indicate a second data state. An MLC uses multiple $V_t$ ranges that each indicates a different data state. Multiple level cells can take advantage of the analog nature of a traditional charge storage cell by assigning a bit pattern to a specific $V_t$ range. Single level memory cells permit the storage of a single binary digit (e.g., bit) of data on each memory cell. Meanwhile, multiple level cells permit the storage of two or more binary digits per cell (e.g., 2, 3, 4, 5 bits), depending on the quantity of Vt ranges assigned to the cell and the stability of the assigned Vt ranges during the lifetime operation of the memory cell. By way of example, one bit (e.g., 1 or 0) may be represented by two Vt ranges, two bits by four ranges, three bits by eight ranges, etc Neural networks implement methods for interpreting particular types of information (e.g., data), such as information obtained in response to sensing a physical phenomenon (e.g., sensing stimuli) in a particular environment, and in response generating one or more outputs. A common goal of neural networks is to mimic a system, such as the human brain, so as to learn to interpret and respond to particular stimuli. For example, human beings have an ability to observe and identify an object even without having an exact match in their memory of what is being observed. A person might be able to recognize another person even though one or more traits of the other person have changed. For example, a person might still be able to recognize another person even though the other person has changed their hair color, grown or removed facial hair, etc.

Electronic systems typically are proficient at confirming an exact match between something sensed by the system, such as with an electronic camera, and something stored in its memory. However, electronic systems are less proficient at identifying and interpreting an object that might be similar, yet somewhat different, than what the system might have stored in its memory. Continuing with the previous example, an electronic system might not be able to identify a person whose image is stored in the system memory if that person has changed their hair color or added/removed facial hair, etc.

Figure 2:
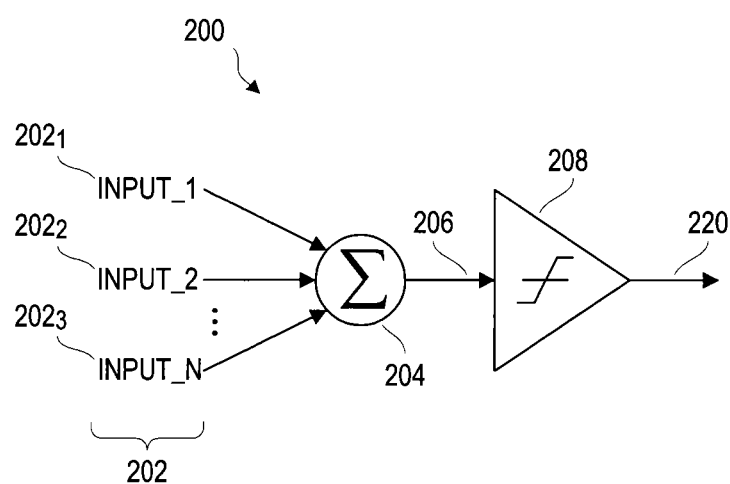
FIG. 2 illustrates a graphical representation of a neuron model.

A typical structure of neural networks is to mimic networks of neurons, such as found in a human brain, by utilizing small building blocks (e.g., neuron models) to attempt to emulate the neurons of a neural network. FIG. 2 illustrates a graphical example of a simulated neuron (e.g., neuron model) used to attempt to mimic a neuron of a human brain, for example. These neuron models are sometimes referred to as perceptrons. The neuron model 200 comprises a number of inputs INPUT_1-INPUT_N 202. Signals applied to these inputs might take the form of various types of signals (e.g., sometimes referred to as features) and are generated responsive to sensing some form of stimuli, such as a voltage, a current or a particular data value (e.g., binary digits), for example. The number of inputs of a particular neuron model might be one to N. The neuron model 200 includes a function, such as a summation function 204, to process signals received on the one or more inputs 202. For example, the summation function 204 might perform an addition operation on signals received at the inputs 202, for example. The neuron model 200 further comprises a function 208 to respond to a value corresponding to the summed inputs 206 and to generate a particular response at the output 220. Outputs of neuron models are sometimes referred to as classes.

Various functions might be utilized for the function 208. For example, function 208 might comprise a function to determine if the summed value 206 is above or below a particular threshold level. Such a threshold function might generate a logic high output potential on the output 220 if the summed inputs 206 are equal to or greater than the particular threshold level and might generate a logic low potential on the output 220 if the summed inputs 206 are below the particular threshold level, for example. According to one or more embodiments of the present disclosure, the function 208 might comprise a sigmoid function, wherein the sigmoid function might be expressed as $f(x)=1/(1+e^{-\lambda x})$, where $\lambda$ might comprise some constant value. Thus, the function 208 might comprise a non-linear function. The generated output value at the output 220 can be applied to one or more additional neuron models (e.g., such as to inputs 202 of different neuron models) which comprise a neural network of neuron models according to various embodiments of the present disclosure.

Figure 3:
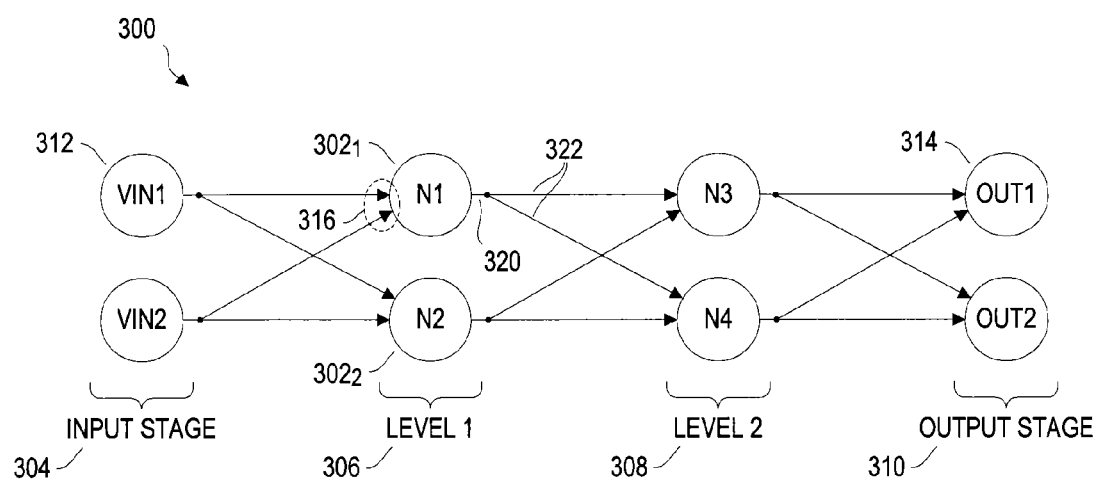
FIG. 3 illustrates a graphical representation of a neural network.

FIG. 3 illustrates a graphical representation of a neural network 300. The neural network shown in FIG. 3 comprises an input stage 304, a first level of neuron models N1, N2 306, a second level of neuron models N3, N4 308 and an output stage 310. Neural networks according to various embodiments can comprise many more than two inputs and two outputs. Neuron model N1 $302_1$ might comprise a neuron model such as neuron model 200 shown in FIG. 2. The arrows indicated at 316 might correspond to INPUT_1 $202_1$ and INPUT_2 $202_2$ shown in FIG. 2, whereas the output 220 of neuron model 200 is indicated at 320 shown in FIG. 3. As discussed with respect to output 220 of FIG. 2, the output 320 of neuron model $302_1$ might be applied to one or more different neuron models of the network such as indicated by arrows 322. Thus, the output of each neuron model of a first level (e.g., LEVEL 1 306) is applied to an input of each neuron model of a second level (e.g., LEVEL 2 308) of the neural network 300, for example. This can be referred to as a feed-ward design neural network.

The input stage 304 comprising initial input signals (e.g., VIN1, VIN2) to the neural network 300 may have been supplied by additional circuitry of an electronic system incorporating the neural network. Each input node 312 might comprise circuitry such as registers and/or driver circuits, for example. The output stage 310 is configured to transfer neural network output values to additional circuitry of the electronic system. Output nodes 314 might comprise circuitry such as registers and/or driver circuits, for example.

Figure 4:
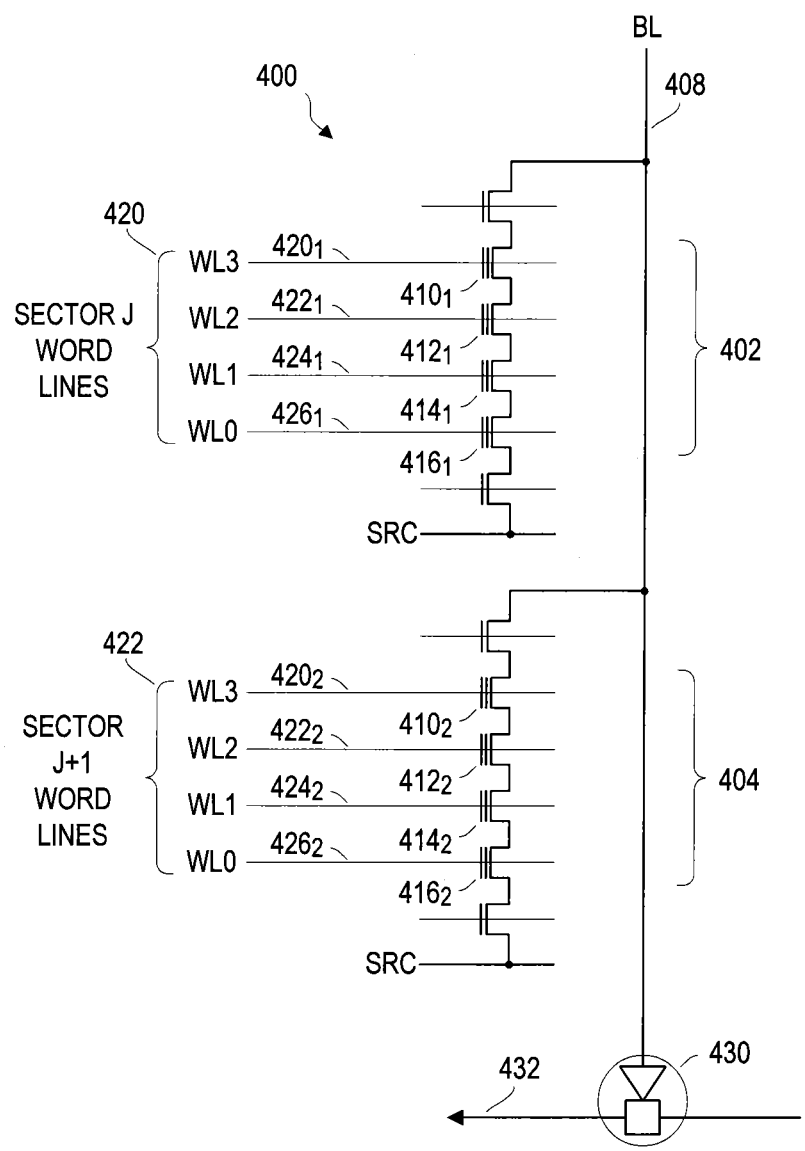
FIG. 4 illustrates a schematic representation of a portion of a memory device configured to facilitate neural network operations according to an embodiment of the present disclosure.

Memory devices and methods according to various embodiments of the present disclosure include operating memory cells of a memory array as one or more neuron models such as to facilitate a neural network in the memory device. The memory array might comprise a NAND configured array of charge storage (e.g., Flash) memory cells, for example. FIG. 4 illustrates a portion of an array 400 of NAND configured memory cells 410-416 according to various embodiments of the present disclosure. The memory cells 410-416 can be charge storage memory cells, for example. A first string of memory cells 402 is coupled to a bit line BL 408. A second string of memory cells 404 is coupled to the same bit line BL 408. Although FIG. 4 illustrates two strings of memory cells 402, 404, various embodiments according to the present disclosure might comprise one or more strings of memory cells coupled to a bit line. Bit line 408 is coupled to sense circuitry 430. Sense circuitry 430 might comprise sense amplifiers, comparators and data latches. For example, the sense circuitry 430 can latch single or multiple bits of data corresponding to a current or voltage sensed on the bit line BL 408 during a sense operation (e.g., read operation) performed on one or more memory cells coupled to the bit line 408.

According to various embodiments of the present disclosure, a neuron model as facilitated in a NAND array of memory cells may comprise one or more concurrently selected memory cells of one or more strings of memory cells coupled to a common bit line. The number of inputs of a neuron model might equal the number of selected strings comprising a selected memory cell which are coupled to the same bit line. For example, one or more two input neuron models may be described by way of reference to FIG. 4. A two input neuron model might comprise a selected memory cell from string 402 and concurrently a selected memory cell from string 404, such as memory cells $410_1$ and $410_2$, for example. A three input neuron model might comprise a selected memory cell from string 402, a selected memory cell from string 404 and a selected memory cell from a third string of memory cells (not shown) where each string is coupled to the same bit line, such as BL 408, for example. An output of the neuron model might comprise a signal generated on an output line 432 coupled to the sense circuitry 430, for example.

A memory cell of each of one or more strings of memory cells coupled to the same bit line can be selected to collectively form a portion of a neuron model. Thus, the neuron model might comprise a selected memory cell from one or more strings of memory cells, a bit line coupled to each of the selected strings of memory cells and the sense circuitry coupled to the bit line. For example a neuron model according to various embodiments of the present disclosure might comprise selected memory cells $412_1$ and $412_2$, bit line 408 and the sense circuitry 430. A different neuron model might comprise selected memory cells $414_1$ and $414_2$, the bit line 408 and sense circuitry 430, for example.

The operation of a neuron model incorporating one or more memory cells of one or more strings of memory cells might be further described by way of example. Word lines of a first sector of memory, such as Sector J 420, can be driven independently from word lines of a second sector, such as Sector J+1 422. Word lines of sectors 420, 422 are driven by word line drivers (not shown) coupled to the word lines. To operate the memory array 400 as a first neuron model, a memory cell from string 402 and a memory cell from string 404 are selected. For example, memory cells $410_1$ and $410_2$ might comprise the memory cells of a first neuron model having two inputs. It should be noted that each of the memory cells of string 402 and/or each of the memory cells of string 404 may have been programmed to a respective one of a number of different data states during a previous operation of the memory device.

The word lines $420_1$ and $420_2$ coupled to the selected memory cells $410_1$, $410_2$ might each be biased to a first potential and to a second potential, respectively. The first potential and the second potential comprise input potentials for the particular neuron model presently operating. The input potentials might comprise inputs received by a memory device as initial inputs for the neural network to act upon. Alternatively, the input potentials may comprise output signals generated previously by other neuron models of the memory device, for example. The signals (e.g., input potentials) applied to the word lines coupled to the selected memory cells might have been subject to some amount of signal conditioning prior to being applied to the word lines. The remaining word lines of each string (e.g., other than those coupled to selected memory cells) might be biased at a potential (e.g., Vpass potential) sufficient to cause the coupled memory cells to be activated (e.g., conduct) regardless of their respective data states.

During a sense operation, BL 408 might be pre-charged to a particular level prior to concurrently applying the first and second input potentials to the two selected memory cells $410_1$, $410_2$ comprising the first neuron model. As discussed above, unselected memory cells of strings 402 and 404 are operated in a pass through mode to conduct regardless of any data state they might be in. Thus, the amount of current present on the bit line BL 408 during the sense operation is dependent upon the data states of the two selected memory cells and the potentials (e.g., input potentials) applied to their respective word lines. For example, the bit line current on BL 408 comprises a sum of the current, if any, flowing through each string of memory cells responsive to the conductive state of the selected memory cells of strings 402 and 404. As discussed above, unselected memory cells of strings 402 and 404 are operated in a pass through mode to conduct regardless of any data state they might be in.

Sense circuitry 430 is configured to respond to the bit line current and generate an output responsive to the bit line current. The generated output might comprise various types of signals. The output signal might comprise a particular voltage level. The generated output signal might comprise a digital representation (e.g., one or more bits) representative of the current sensed in the bit line BL 408, for example. The generated output signal might then be applied to an input of one or more different neuron models and/or to an output of the neural network, for example.

A second neuron model (e.g., different neuron model than the neuron model comprising memory cells $410_1$, $410_2$ described above) might be facilitated utilizing the same strings of memory cells 402, 404 coupled to the same bit line BL 408 shown in FIG. 4. However, a different memory cell of each string is selected for facilitating the second neuron model. For example, memory cells $412_1$ and $412_2$ might comprise the selected memory cells for the second neuron model and the remaining memory cells of each string are operated in a pass through mode when performing a sense operation on the second neuron model. A third neuron model might be facilitated by selecting memory cells $414_1$ and $414_2$ and operating the remaining memory cells of each string in pass through mode. Thus, the number of neuron models which can be facilitated by one or more strings of memory cells coupled to the same bit line might be equal to the number of memory cells comprising each string, for example.

The number of inputs (e.g., such as up to INPUT_N $203_3$) shown in FIG. 2) of each neuron model might comprise the number of selected strings of memory cells coupled to the same bit line. For example, FIG. 4 illustrates two selected strings of memory cells 402, 404 where each selected string comprises four memory cells. Thus, four different neuron models each having two inputs might be facilitated using the two strings of memory cells 402, 404 shown in FIG. 4. However, the strings of memory cells can comprise one or more memory cells, such as 64, 128 or more memory cells per string according to various embodiments of the present disclosure. Thus, the number of inputs of each neuron model can be assigned by selecting a particular number of strings of memory cells coupled to the same bit line. It should be noted that not all memory cells of each string of memory cells and not all strings of memory cells coupled to the same bit line must be selected to comprise one or more neuron models. A number less than the number of memory cells comprising each string might be selected and a number of strings less than the total number of strings coupled to the same bit line might be selected, for example.

Figure 5A:
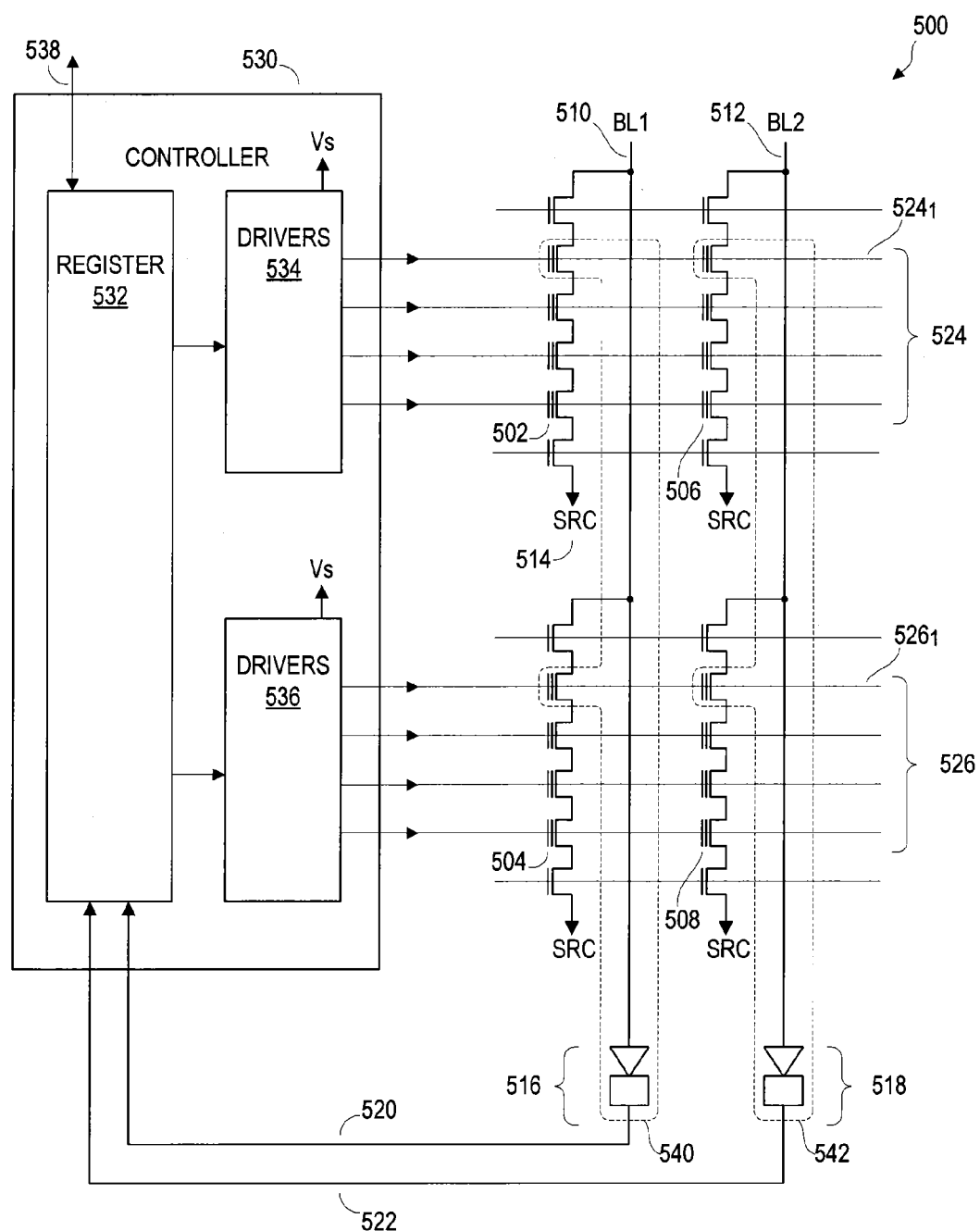
FIGS. 5A-5D illustrate a schematic representation of a portion of a memory device configured to facilitate neural network operations according to an embodiment of the present disclosure.

FIGS. 5A-5D illustrate a portion of a memory device 500 according to various embodiments of the present disclosure. FIG. 5A illustrates four strings of memory cells 502-508. Each string of memory cells is coupled between a bit line 510, 512 and a source 514. Each string 502-508 comprises four memory cells per string, although various embodiments are not limited to four memory cells per string. Each bit line 510, 512 is coupled to sense circuitry 516 and 518, respectively. The sense circuitry 516, 518 might comprise circuitry configured to sense a particular current and/or voltage present on the associated bit line. Sense circuitry 516, 518 might further comprise one or more registers to store particular data values (e.g., bits) representative of a current and/or voltage sensed on the associated bit line, for example. The sense circuitry 516, 518 are further configured to drive an output line 520, 522, respectively. The output lines 520, 522 might comprise one or more signal lines each or might be combined to form a bus (e.g., serial or parallel bus) for example. Output signals presented on the output lines 520, 522 might comprise discrete signals (e.g., logic high, logic low) or might comprise analog signals, such as a particular voltage within a certain range of voltages, for example. In a 5V system the output signals might either be 0V or 5V in a digital representation whereas the output signals might be any voltage from 0V to 5V in an analog system, for example.

The memory device illustrated in FIG. 5A further illustrates a controller 530. The controller 530 comprises an access line (e.g., word line) register 532. The word line register 532 can be configured to store data representative of particular voltages to be applied to word lines 524, 526 coupled to the strings of memory cells 502-508 during operation of the memory device, for example. Controller 530 further comprises word line drivers 534, 536. The word line drivers 534, 536 are configured to generate and apply particular voltages to the word lines 524, 526, such as responsive to data stored in the word line register 532, during operation of the memory device 500. Controller 530 might further comprise an input/output (e.g., bi-directional) interface 538 configured to transfer and/or receive data and or commands into and out of the controller 530, for example. Interface 538 may comprise a multi-signal bus, for example.

A method of facilitating a neural network in a memory device according to one or more embodiments of the present disclosure can be described by way of reference to FIG. 2, FIG. 3 and FIGS. 5A-5D. The strings of memory cells 502-508 shown in FIG. 5A may have been programmed to particular data states (e.g., which define operating characteristics of the neural network) during a previously performed memory device operation. A neural network comprising two inputs and four levels where each neuron model of the network comprises two inputs can be described by reference to FIGS. 5A-5D. Two input values (e.g., initial input) are received by the word line register 532, such as received over the interface 538. The two input values might comprise data values each comprising one or more bits of data, for example. The word line register 532 facilitates the configuration of the word line drivers 534, 536 responsive to the received input values.

The first level of neuron models of FIG. 5A, such as similar to neuron models N1, N2 306 shown in FIG. 3, might be illustrated by the dashed lines 540 and 542 shown in FIG. 5A, respectively. The dashed line region, such as 540 is representative of a first neuron model N1 $302_1$, such as shown in FIG. 3 The dashed line region 542 is representative of a second neuron model, such as N2 $302_2$. The input nodes to the neuron model 540 might be represented by the word lines $524_1$, $526_1$ coupled to the two selected memory cells comprising the neuron model 540. The output 520 of the neuron model 540 might be represented by the output signal line 220 of FIG. 2, for example.

During a first sense (e.g., read) operation of the neural network illustrated by FIG. 5A, the word lines $524_1$, $526_1$ coupled to the first level neuron models 540 and 542 are biased by the word line drivers 534, 536 with potential responsive to the two input values initially received and stored in the word line register 532. The remaining word lines are biased to a Vpass potential to activate each unselected memory cell of the memory cell strings. Sense circuitry 516, 518 performs a sense operation on the bit lines BL1 510 and BL2 512. The current and/or voltage sensed on the bit lines will be dependent on the word line bias applied to each memory cell of the two neuron models and the respective data state of each memory cell of each neuron model. For example, the current sensed on BL1 510 might correspond to the sum of current flowing through the two memory cells (shown enclosed by dashed line 540) of neuron model 540 from BL1 to the source 514 while word lines $524_1$ and $526_1$ are biased with the two initial input potentials. A data value representative of the current sensed in BL1 510 during the first read operation might be latched in the sense circuitry 516 and transferred over the output signal line 520, for example. The data value representative of the current sensed in BL1 510 might comprise a single bit data value (e.g., a '1' or '0'). Alternatively, the data value may comprise a multi-bit value, such as a four bit data value, for example. The data value latched in the sense circuitry 516 may be transferred over the output signal line 520 in a serial or parallel manner. A similar sense operation as described above with respect to BL1 510 is concurrently performed on the bit line BL2 512 according to various embodiments of the present disclosure.

Upon completion of the first sense operation of the neuron models 540 and 542, the word line register 532 receives the sensed data values transferred over the output signal lines 520, 522 and stores them in the word line register. A second sense operation is then performed on a second level of neuron models. The second level of neuron models are represented (e.g., by dashed lines) by neuron models 544, 546 shown in FIG. 5B. For example, the two neuron models 544, 546 shown in FIG. 5B might be representative of the neuron models N3, N4 shown in LEVEL 2 308 of FIG. 3, for example.

Figure 5B:
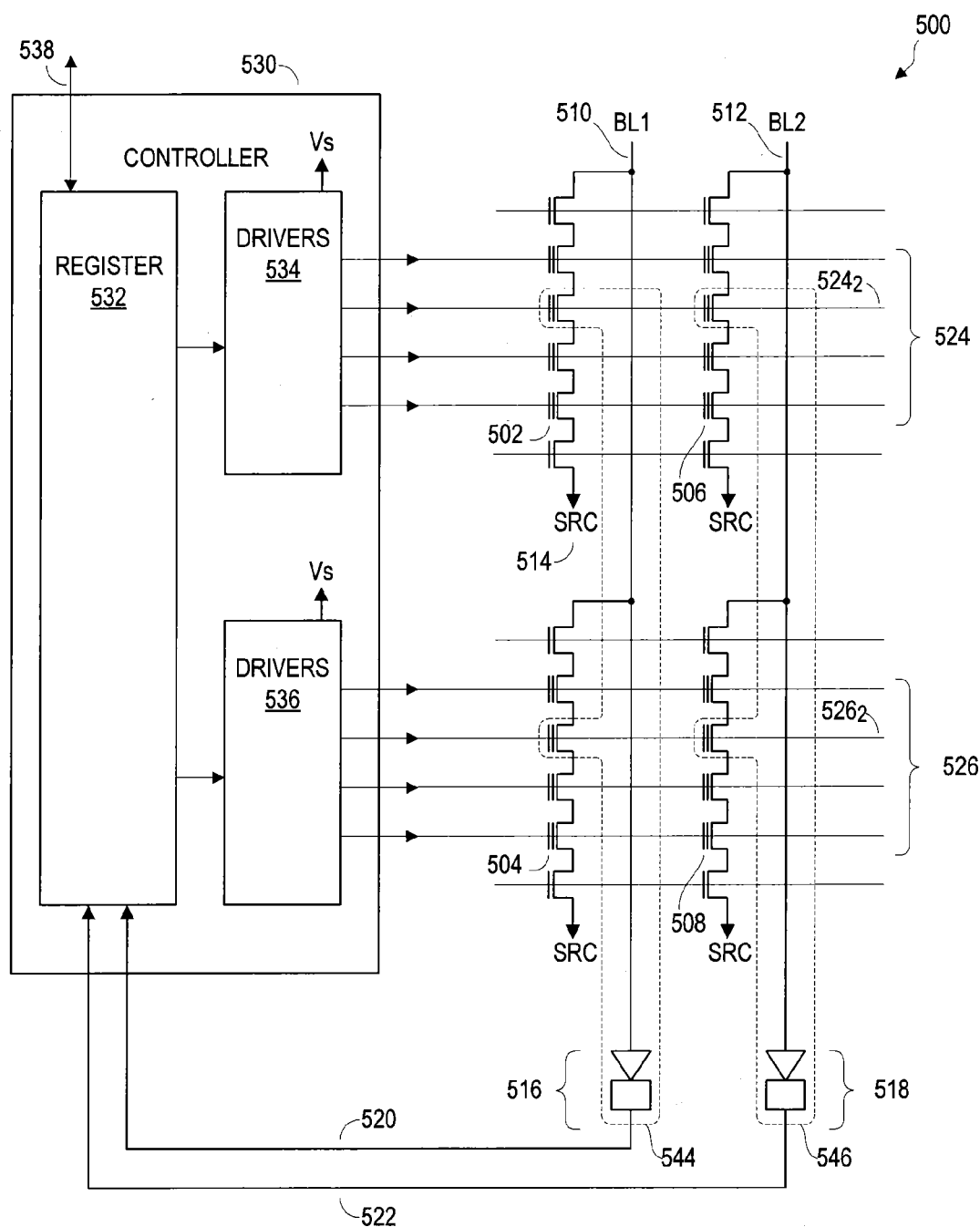

During the second sense operation of the neural network illustrated by FIG. 5B, the word lines $524_2$, $526_2$ coupled to the memory cells of the second level neuron models 544 and 546 are biased by the word line drivers 534, 536 with potentials responsive to the two output data values transferred by the sense circuitry 516, 518 to the word line register 532 following the completion of the first sense operation. The remaining word lines coupled to unselected memory cells might be biased to a Vpass potential to operate the remaining memory cells in a pass through mode. Sense circuitry 516, 518 performs a sense operation on the bit lines BL1 510 and BL2 512 as part of the second sense operation. Data values representative of the current sensed in the bit lines during the second sense operation are latched in the sense circuitry 516, 518 and are transferred over the output signal lines 520, 522 to the word line data register 532. The current and/or voltage sensed on the bit lines BL1, BL2 will be at least partially dependent on the word line potential applied to each memory cell of the two neuron models 544, 546 and the respective data state of each of the selected memory cells comprising the two neuron models 544, 546.

Figure 5C:
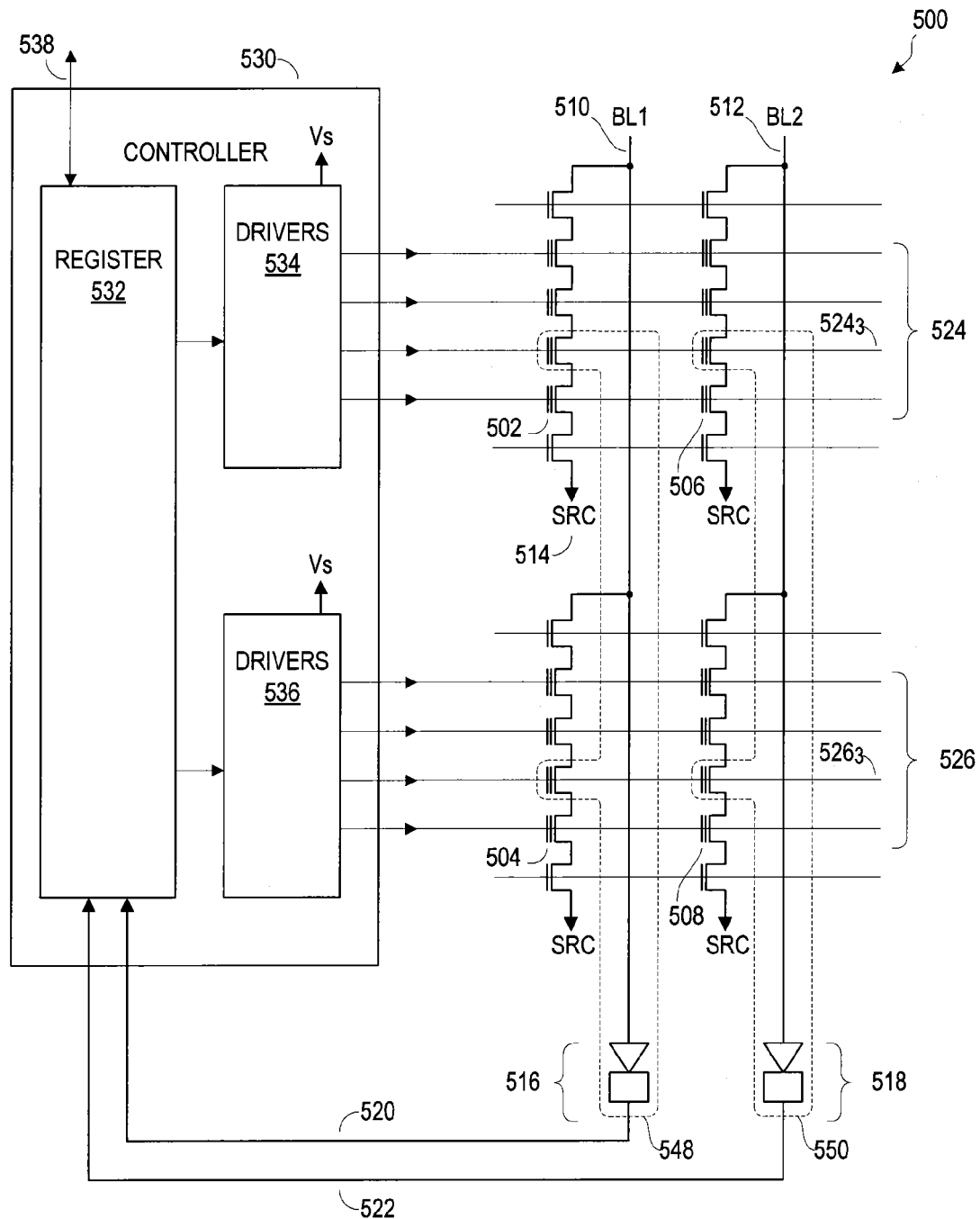

A third sense operation is illustrated by way of reference to FIG. 5C, such as to facilitate a third level of the neural network not shown in FIG. 3 but similar to LEVEL 2 308 shown in FIG. 3. It should be noted that FIG. 3 only illustrates a two level neural network in contrast with a four level neural network shown and described with respect to FIGS. 5A-5D. During the third sense operation of the neural network illustrated by FIG. 5C, the word lines 524$_3$, 526$_3$ coupled to the third level neuron models 548 and 550 are biased by the word line drivers 534, 536 with potentials responsive to the two output data values transferred by the sense circuitry 516, 518 to the word line register 532 following the completion of the second sense operation. The remaining word lines coupled to unselected memory cells might be biased to a Vpass potential to operate the remaining memory cells in a pass through mode. Sense circuitry 516, 518 performs a sense operation on the bit lines BL1 510 and BL2 512 as part of the third sense operation. Data values representative of the current sensed in the bit lines during the third sense operation are latched in the sense circuitry 516, 518 and are transferred over the output signal lines 520, 522 to the word line data register 532, for example. The current and/or voltage sensed on the bit lines BL1, BL2 will be at least partially dependent on the word line bias applied to each memory cell of the two neuron models 548, 550 and the respective data state of each memory cell comprising the two neuron models 548, 550.

Figure 5D:
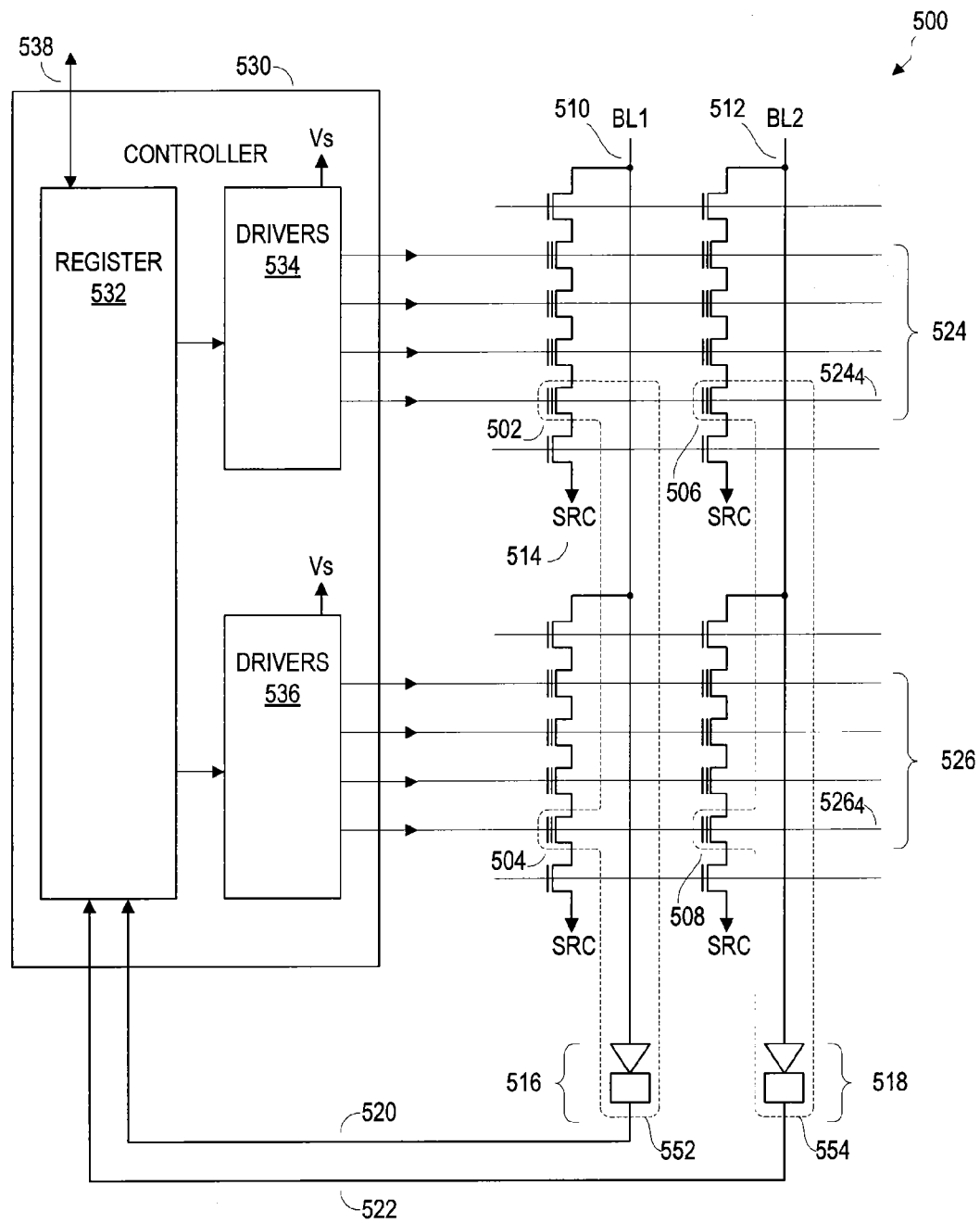

A fourth sense operation is illustrated by way of reference to FIG. 5D, such as to facilitate a fourth level of the neural network similar to LEVEL 2 308 shown in FIG. 3. During the fourth sense operation of the neural network illustrated by FIG. 5D, the word lines 524$_4$, 526$_4$ coupled to the fourth level neuron models 552 and 554 are biased by the word line drivers 534, 536 with potentials responsive to the two output data values transferred by the sense circuitry 516, 518 to the word line register 532 following the completion of the third sense operation. The remaining word lines coupled to unselected memory cells might be biased to a Vpass potential to operate the remaining memory cells in pass through mode. Sense circuitry 516, 518 performs a sense operation on the bit lines BL1 510 and BL2 512 as part of the fourth sense operation. Data values representative of the current sensed in the bit lines during the fourth sense operation are latched in the sense circuitry 516, 518 and are transferred over the output signal lines 520, 522 to the word line data register 524, for example. The current and/or voltage sensed on the bit lines BL1, BL2 will be at least partially dependent on the word line bias applied to each memory cell of the two neuron models 552, 554 and the respective data state of each memory cell of the two neuron models.

Upon completion of the fourth sense operation of the neural network, the output data values, such as generated by sense circuitry 516, 518 during the fourth sense operation, might be transferred from the sense circuitry registers to the word line register 532 as discussed above. The word line register 532 can transfer the data values from the word line register over the bidirectional interface 538 to another portion of the memory device (not shown) such as control logic or to a memory access device (e.g., processor) coupled to the memory device, for example. According to additional embodiments, the output data values generated responsive to the fourth sense operation might be made available as input values to another neural network within the memory device, such as located in different sectors, pages or blocks of memory, for example. Thus, the output data values of a first neural network might comprise the input values for a second neural network within the memory device according to various embodiments of the present disclosure.

Although the example discussed with respect to FIGS. 5A-5D illustrated neural network sense operations wherein each memory cell of each string is included within a neuron model, the various embodiments are not so limited. Further, the example illustrated and discussed with respect to FIGS. 5A-5D comprises a four level neural network having two input neuron models with two neuron models per level. However, many different configurations of neural networks might be facilitated according to various embodiments of the present disclosure. For example, the configuration of a particular neural network might be assigned by selecting a number of variables to define the network. The number of inputs per neuron model might be assigned by selecting a number of strings of memory cells coupled to each of one or more selected bit lines. For example, a two input neuron model might concurrently comprise a selected memory cell from two strings of memory cells coupled to the same bit line. A three input neuron model might concurrently comprise a selected memory cell from three strings of memory cells coupled to the same bit line, etc. The number of neuron models per level (e.g., two neuron models per level as shown in FIG. 3) might be assigned by selecting a number of bit lines coupled to strings of memory cells. A number of levels of a particular neural network (e.g., 2 levels as shown in FIG. 3) can be assigned by selecting a number of memory cells of each string which will be selected as part of each neuron model. A four level neural network, such as discussed with respect to FIGS. 5A-5D can be facilitated with strings of memory cells having at least four memory cells per string, a 64 level neural network can be facilitated with strings of memory cells comprising at least 64 memory cells per string, etc.

The operating characteristics of a neural network according to various embodiments of the present disclosure might be at least partially defined by programming the memory cells used in neuron models comprising the neural network to various data states. The respective data state (e.g., threshold voltage Vt) of individual memory cells can facilitate a weighting function respective to inputs applied to the memory cells. For example, a higher Vt of a memory cell will require a higher input potential be applied to activate the memory cell. These data states might be determined in various ways. For example, the data states might be determined by applying particular stimuli to the neural network, such as in a laboratory environment, to determine a particular programming pattern of the memory cells which generates one or more desired operating characteristics of the neural network. This is sometimes referred to as a learning phase for the neural network. It should be noted that one or more methods of facilitating weighting effects in a memory device, such as to affect currents sensed on bit lines of memory devices, is disclosed in 61/625,286, which is commonly assigned.

Operating characteristics of neural networks according to various embodiments of the present disclosure might further be established by configuring the sense circuitry of the memory device. For example, the sense circuitry (e.g., sense circuitry 516, 518 shown in FIG. 5A) can be configured to affect the manner in which output data corresponding to currents sensed during read operations are determined. For example, the gain of amplifier circuitry comprising the sense circuitry might be adjusted. The gain might be permanently configurable. The gain might also be set, such as at power up of the memory device, responsive to setting a value in a register or other controlling circuitry wherein the value is representative of a desired gain setting to be utilized.

Particular neuron models have been described comprising strings of memory cells coupled to a single bit line. However, a particular neuron model might be facilitated by memory cell strings coupled to more than one bit line. For example, the current sensed on two or more bit lines might be combined (e.g., summed) to generate a single data output for the particular neuron model comprising the two bit lines. Combining the outputs generated from sensing two bit lines might facilitate improved sensing margin and reduce issues such as current saturation effects during sense operations, for example.

As discussed above, FIG. 5A illustrates two neuron models as indicated by 540 and 542. However, according to one or more embodiments the output data values transferred on output signal lines 520 and 522 might be combined (e.g., summed) to generate a single output data value for the particular neuron model. For example, the summed output data value might comprise a value representative of the sum of the current sensed on bit lines 510 and 512. Thus, a number of inputs assigned to a particular neuron model might comprise the number of selected bit lines associated with the particular neuron model multiplied by the number of selected strings coupled to each selected bit line. For example, by combining the outputs of the two neuron models 540 and 542, a single four input neuron model might be realized.

Similar to combining the output data generated responsive to sensing two or more bit lines to generate a single output data value discussed above, two or more word lines coupled to each string might be biased with input data during a sense operation according to various embodiments of the present disclosure. Remaining word lines coupled to unselected memory cells of the string of memory cells might be biased to a Vpass potential as discussed above. For example, referring to FIG. 4, a first neuron model might comprise selected memory cells $410_1$ and $412_1$ of string 402 and selected memory cells $410_2$ and $412_2$ of string 404 along with BL 408 and sense circuitry 430. Thus, during a first sense operation on the first neuron model, word lines $420_1$, $422_1$, $420_2$ and $422_2$ might be biased with potentials representative of initial input data to the neural network. A second neuron model might comprise selected memory cells $414_1$ and $416_1$ of string 402 and selected memory cells $414_2$ and $416_2$ of string 404 along with BL 408 and sense circuitry 430. Thus, during a second sense operation, word lines $424_1$, $426_1$, $424_2$ and $426_2$ might be biased with potentials generated responsive to output data generated during the first sense operation. The first and second sense operations might be performed to sense a current or a voltage on the BL 408 during the sense operation, for example.

Although the present example discusses two word lines coupled to two selected memory cells per string being biased during a particular sense operation, the various embodiments are not so limited. For example, one or more word lines coupled to one or more selected memory cells per string of memory cells might be biased during a particular sense operation performed on the neural network, for example. A method of biasing two selected memory cells of the same string of memory cells and facilitating a sense operation on a bit line coupled to the string is disclosed in 61/602,249, which is commonly assigned. As discussed above, remaining memory cells (e.g., unselected memory cells) of each string might be biased to a Vpass potential to operate the unselected memory cells in a pass through mode during each sense operation performed on the neural network, for example.

Figure 6:
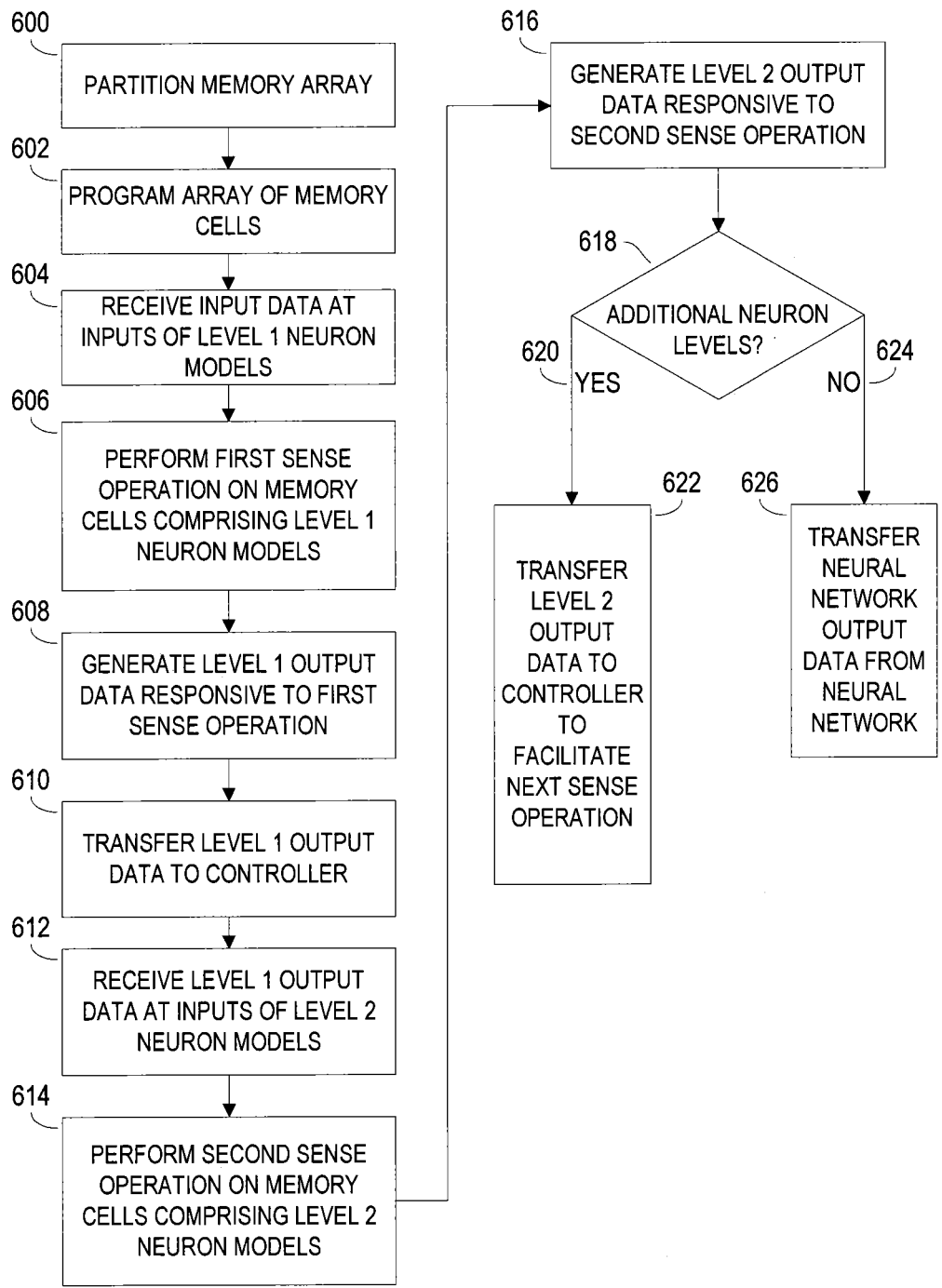
FIG. 6 illustrates a flow chart of a method according to an embodiment of the present disclosure.

FIG. 6 illustrates a flow chart of a method of operating a memory device as a neural network, such as illustrated in FIGS. 3 and 5A-5D according to one or more embodiments of the present disclosure. Referring to FIG. 6, a portion of a memory array of a memory device might be configured (e.g., partitioned) 600 to facilitate a neural network. The partition might comprise the entire array of memory cells or might comprise a part of the memory array. For example, portions of particular blocks, sectors, pages and/or strings of memory cells can be configured to facilitate a neural network operating mode according to various embodiments of the present disclosure. Portions of the array not configured to facilitate a neural network might be operated as a standard memory storage device, for example.

A programming operation can be performed 602 on memory cells of one or more neural network partitions of the memory device. The memory cells might be programmed as single level memory cells and/or multi level memory cells. The data states of the memory cells might have been previously determined in order to facilitate a particular operating characteristics which the neural network is to exhibit. The partitioning and programming of the memory array is performed prior to operating the memory device in a neural network operating mode according to various embodiments of the present disclosure.

The data programmed in the array of memory cells might be generated by performing an operation to model a system that the neural network is intended to emulate. For example, the desired response characteristics of the system responsive to particular stimuli (e.g., inputs) might be modeled in a laboratory setting. A particular data set can be generated which when programmed into a memory device according to various embodiments of the present disclosure mimics the response of the system modeled in the laboratory. Thus, the operating characteristics of a neural network can be changed by changing the data state of one or more memory cells comprising the neural network, for example.

Subsequent to partitioning 600 and programming 602 the memory array comprising the neural network, the memory device might receive an indication, such as a command from a memory device controller coupled to the memory device, to access the neural network partition of the device. The command might comprise a command to access the neural network along with one or more signals as input values to the neural network. The received input values 604 are used to facilitate a first sense operation on the neuron models of a first level (e.g., LEVEL 1 306 shown in FIG. 3 and/or FIG. 5A) of neural models of the neural network.

A sense operation is performed 606 on the neural models of the first level of neural models responsive to the received inputs 604. Output signals (e.g., output data) are generated 608 responsive to the sense operation performed 606 on the first level of neural models. The generated output data of the first level of neural models is transferred 610 to a controller, such as controller 530 shown in FIG. 5A. Word line drivers generate word line voltages responsive to the received neural network LEVEL 1 output data and bias the word lines of the array to perform another (e.g., second) sense operation on a second level of neural models of the neural network. Thus, the memory cells of the neural models of the second level of neural network receive 612 their respective inputs by the potential of the word lines generated responsive to the output data generated during the first sense operation.

A second sense operation 614 of the neural models comprising the second level of neural models can be performed. Output signals (e.g., output data) are generated 616 responsive to the second sense operation performed 614 on the second level of neural models. If it is determined 618 that additional levels of neural models comprise the neural network 620, the generated output signals of the second level of neural models can be output 622 to the controller to facilitate another (e.g., third) sense operation on a third level of neural models of a third level of the neural network, and so on. Thus, according to various embodiments, output data generated during a first sense operation on a first level of a neural network is utilized to determine the inputs to be applied to neuron models of a second level of the neural network during a second sense operation. The output data generated during the second sense operation is utilized to determine the inputs to be applied to neuron models of a third level of neural models of the neural network, and so on. This process might repeat until no additional levels of neuron models remain to be facilitated in the neural network. Thus, as discussed above, the data state of each memory cell of the neuron models comprising the neural network affect the output data generated during each sense operation thereby defining the operating characteristics of the neural network. Neural networks according to various embodiments can have an associated number representative of the levels of neural models comprising a neural network, such as a number 'P' levels of neural models, for example. Thus, a counter might be maintained by the controller where the counter value can be compared to the number P levels of neural models in determining 618 if additional levels of a neural model remain to be sensed, for example. The number of neuron levels P for a neural network might be loaded into the controller during initialization of the memory device, for example.

If it is determined 618 that no additional levels of neural models remain to be facilitated 624, the generated output data of the last level of neural models might be transferred from the neural network 626 as neural network output data. The transferred neural network output data can be transferred to additional circuitry of the memory device, such as data registers or other controlling circuitry configured to store the transferred neural network output data, for example.

Figure 7A:
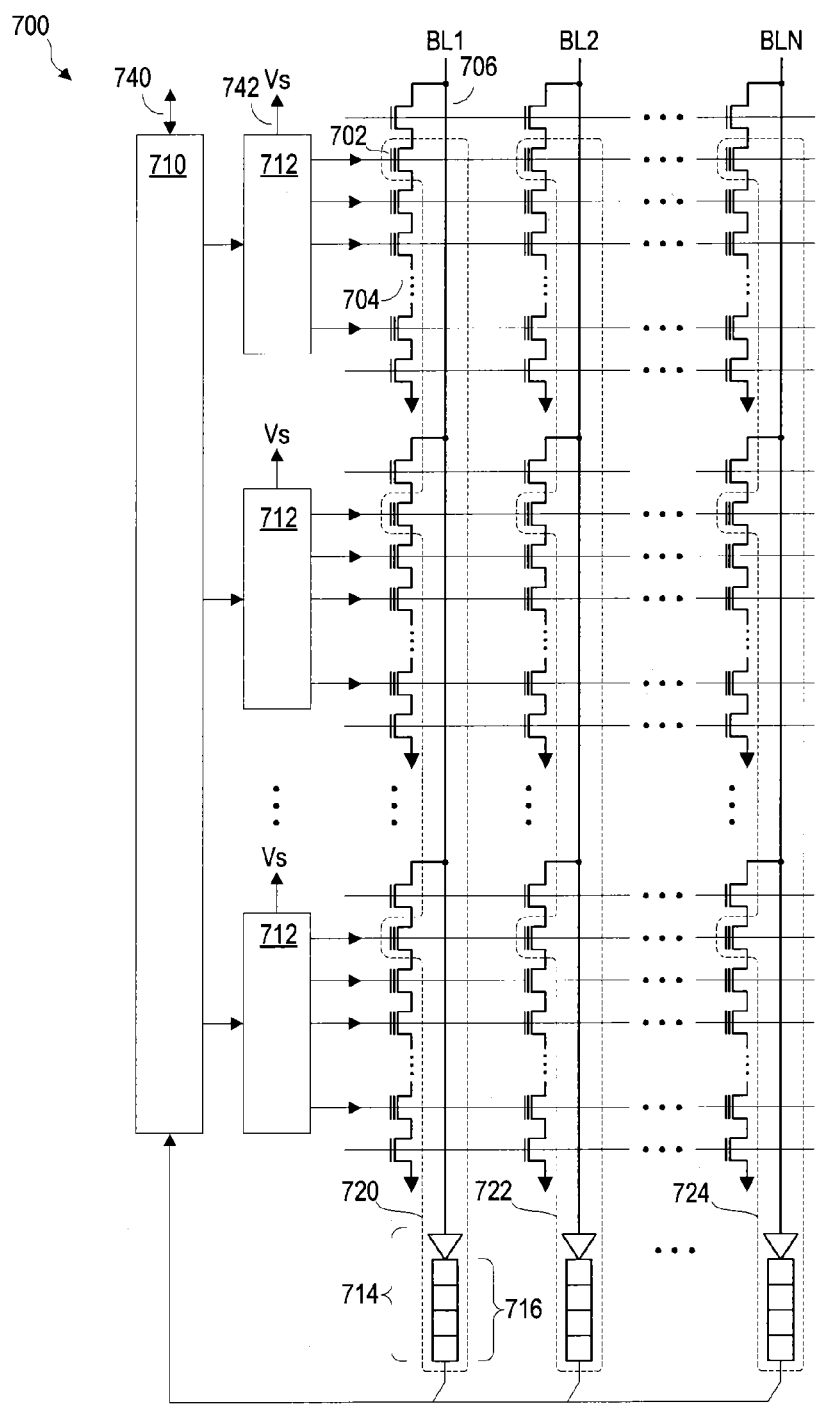
FIGS. 7A and 7B illustrate a schematic representation of a portion of a memory device configured to facilitate neural network operations according to an embodiment of the present disclosure.
Figure 8:
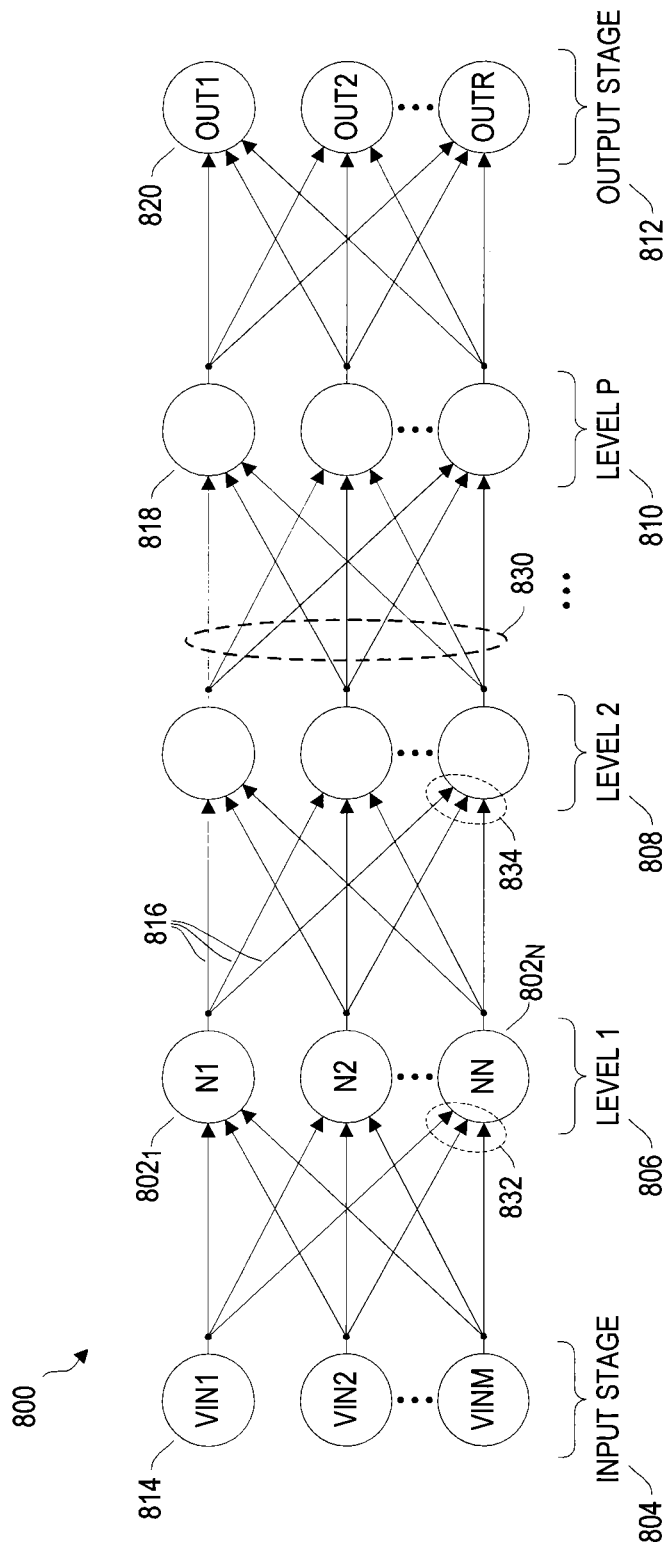
FIG. 8 illustrates a graphical representation of a neural network according to an embodiment of the present disclosure.

FIG. 7A illustrates a portion of a memory device 700 according to various embodiments of the present disclosure. FIG. 8 illustrates a graphical representation of a neural network corresponding to the memory device 700 shown in FIG. 7A. FIG. 8 illustrates a 'P' level 810 (e.g., comprising levels 1-P) neural network 800. Each of the P levels (e.g., LEVEL 1-LEVEL P 806-810) of the neural network 800 comprise 'N' neuron models 802. The input stage 804 of the neural network model 800 further comprises 'M' input nodes 814. The output stage 812 comprises 'R' output nodes 820 according to various embodiments of the present disclosure. The set of variables M, N, P and R might have equal values. However, according to one or more embodiments, a subset of the set of variables M, N, P and R might be equal or each variable might have different values, for example.

The memory device 700 shown in FIG. 7A comprises an array of memory cells (e.g., flash memory cells), such as memory cell 702 logically arranged in rows and in columns, and further arranged into strings 704 (e.g., NAND strings) of memory cells. The memory device 700 comprises N bit lines BL1-BLN 706, where each bit line has M strings of memory cells coupled to it, for example. Each string of memory cells comprises P memory cells per string where each memory cell of each string are coupled source to drain between the coupled bit line and a source. The number of memory cells P per string might be 32, 64, 128 or more memory cells, for example.

The memory device 700 of FIG. 7A further comprises a word line register 710 and 'M' word line driver circuits 712. Sense circuitry 714 is coupled to each bit line 706 of the memory device shown in FIG. 7A. The sense circuitry 714 is configured to sense a voltage and/or current on the coupled bit line during a sense (e.g., read) operation, for example. The sense circuitry is further configured to store (e.g., latch) a data value representative of a voltage and/or current sensed on the coupled bit line during a sense operation. The data value might be stored in a register 716 in the sense circuitry, such as a data latch. The sense circuitry data register might be configured to store one or more binary digits (e.g., bits) of data representative of the voltage and/or current sensed on the coupled bit line. For example, the sense circuitry data register 716 might comprise four latches configured to collectively store a four bit (e.g., '0000'-'1111') representation of the sensed voltage and/or current, for example.

FIG. 7A further illustrates a configuration of a number of neuron models of a neural network, such as the LEVEL 1 neuron models 806 shown in FIG. 8, according to various embodiments of the present disclosure. Each neuron model 720, 722, 724 shown in FIG. 7A is indicated by the dashed lines enclosing a memory cell from each string coupled to a bit line and further coupled to sense circuitry. By way of example, the number of neuron models indicated by dashed lines in FIG. 7A might comprise a first level of the neural network as indicated by the selection of the first memory cell of each string of memory cells coupled to each bit line BL1-BLN 706. For example, the neuron models 720-724 indicated by dashed lines shown in FIG. 7A might correspond to neuron models $802_1$-$802_N$ shown in FIG. 8, respectively.

The number of input data values which can be applied to each neuron model 720-724 comprises in one embodiment the number of strings of memory cells coupled to each bit line and selected for operation in the neural network. Each neuron model comprises a particular number of inputs, such as inputs 202 shown in FIG. 2. Thus, each input of each neuron model might comprise each word line coupled to each memory cell comprising each neuron model according to various embodiments of the present disclosure. Thus, the number of input data values applied to one or more neuron models might comprise one through and including M inputs as there are one through M strings of memory cells coupled to each bit line. Thus, each neuron model 720-724 as shown in FIG. 7A and represented by dashed lines, might comprise M inputs.

The number of neuron models per level might be one through and including N neuron models per level of the neural network, for example. A number of neuron models per level of a neural network according to various embodiments, such as a first level (e.g., LEVEL 1 806 shown in FIG. 8) of a neural network indicated in FIG. 7A, might comprise up to and including the number of selected bit lines 706. As shown in FIG. 7A, the number of neuron models per level of the neural network might comprise N neuron models per level as the dashed lines representing neuron models 720-724 indicate that N bit lines are selected, for example. However, as discussed above, results of sense operations performed on two or more bit lines might be combined to generate a single output value. Thus, the number of neuron models per level might comprise N bit lines divided by the number of bit lines to be combined to generate a single output. For example, 100 bit lines might be selected for a particular neural network where the sensed output of pairs of bit lines are to be combined. Thus, the number of neuron models per level might be 50 neuron models, for example.

Figure 7B:
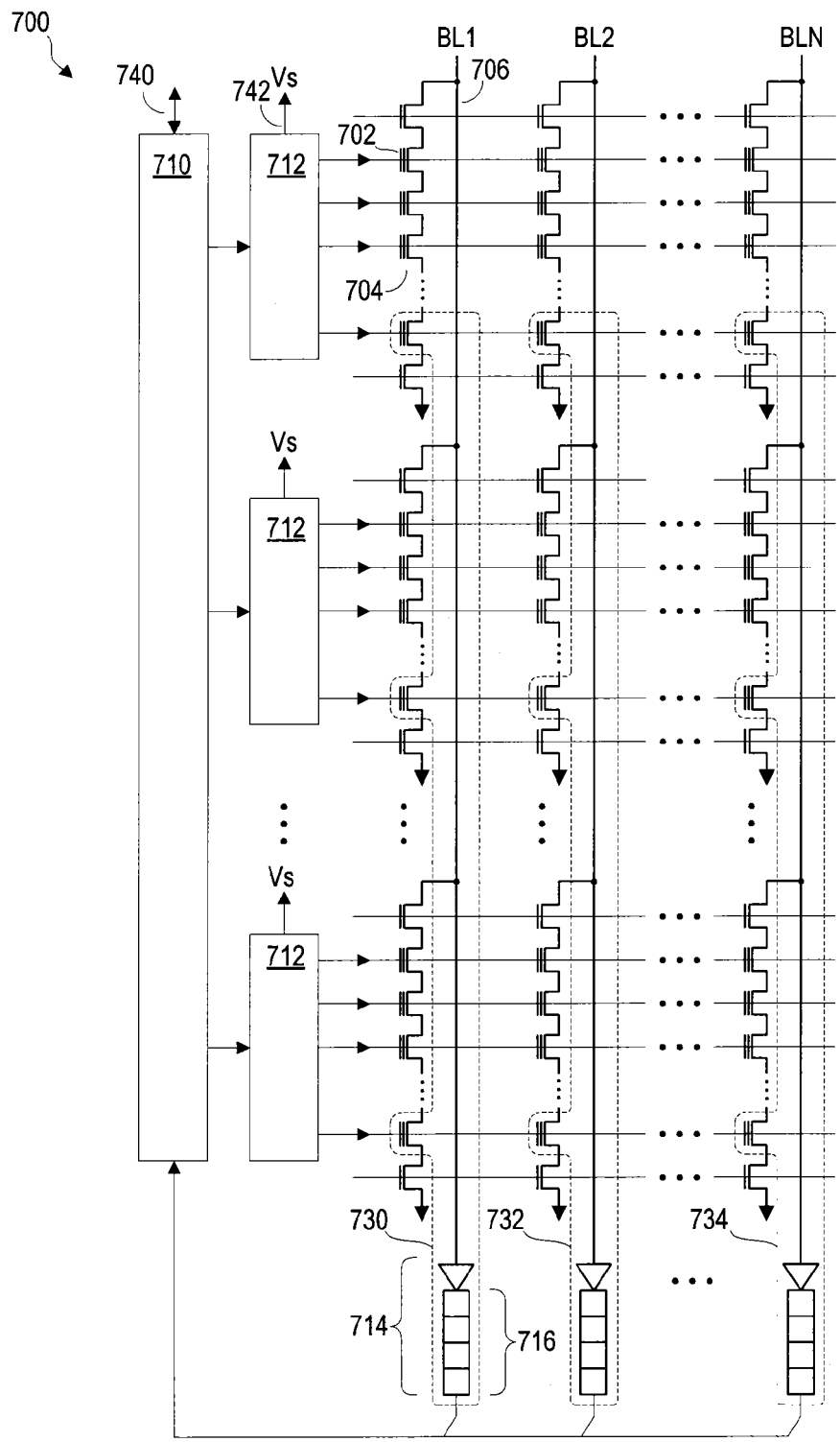

FIG. 7B illustrates the same neural network facilitated in an array of memory such as that shown in FIG. 7A. FIG. 7B illustrates the neuron models 730-734 of the neural network comprising the last level of the neural network. For example, the neuron models of the last level are indicated and comprise memory cells selected during a final sense operation performed on the neural network (whereas FIG. 7A illustrates the neuron models 720-724 selected during a first sense operation performed on the neural network, for example.) As there are P memory cells per string of memory cells as discussed above, the neuron models 730-734 indicated in FIG. 7B might be neuron models selected during a 'Pth' sense operation performed on the neural network, for example.

The size of a particular neural network that can be facilitated according to one or more embodiments of the present disclosure might be further described by way of example and reference to FIG. 7A. A memory device might comprise an array of memory cells comprising 1000 bit lines, such as N bit lines BL1-BLN 706 shown in FIG. 7A. The same array might further comprise 1000 strings of memory cells coupled to each of the 1000 bit lines, such as the M strings 704 of memory cells coupled to each bit line as shown in FIG. 7A. Each string of the 1000 strings of memory cells might comprise 64 memory cells, such as P memory cells 702 per string shown in FIG. 7A. Thus, the particular neural network according to one or more embodiments might facilitate up to 1000 inputs, up to 64 neuron levels with 1,000,000 interconnections between neurons of each level (e.g., as indicated at 830 of FIGS. 8), and 1000 outputs of the neural network, for example.

As discussed above with respect to FIGS. 5A-5D, following each sense operation performed on the neural network shown in FIGS. 7A and 7B, an output data value is determined for each bit line (e.g., neuron model at each level of the neural network) and is stored in the data register 716 of the sense circuitry 714 coupled to each bit line 706. Each stored output value can be fed back to (e.g., transferred to) the word line data register 710. The word line drivers 712 can be configured to apply potentials to the word lines to facilitate the next sense operation on a next level of neuron models of the neural network. For example, the data output values generated during a previous sense operation can be utilized to facilitate generating the word line potentials to be applied during the next sense operation performed on a next level of the neural network. The word line potentials are generated and applied during a current sense operation responsive to the output data values received from the sense circuitry as determined during a previous sense operation. Thus, the output data values determined during a first sense operation are utilized by the word line register 710 and word line drivers 712 to facilitate the generation and application of word line potentials during a second sense operation following the first sense operation. The output data values determined during the second sense operation are utilized by the word line register 710 and word line drivers 712 to facilitate generation and application of word line potentials utilized during a third sense operation following the second sense operation, and so on.

Following the final sense operation to be performed on a particular neural network, the output data values might be transferred from the word line data register 710 over a bi-directional communications interface 740, such as to other portions of the memory device and/or out of the memory device, such as to a memory access device coupled to the memory device as part of an electronic system, for example. Between each sense operation, the output data values might be transferred to other portions of the memory device.

Application of the various word line potentials might be facilitated by various methods according to one or more embodiments of the present disclosure. The applied potentials might comprise a static application of one or more potentials to the various word lines. For example, one or more word lines coupled to unselected memory cells might be biased with a Vpass potential during a sense operation performed on a selected memory cell of one or more strings of memory cells. The potential applied to selected memory cells can comprise a static potential applied to the selected word lines, for example. According to one or more embodiments, the potential applied to one or more selected memory cells might comprise an increasing (e.g., stepped or ramped) potential or might comprise a decreasing (e.g., stepped or ramped) potential applied during the particular sense operation.

As discussed above, the current sensed on more than one bit line might be combined to generate a single output. For example, an output data value for a particular neuron model might comprise a combination of output data values of two or more bit lines. For example, referring to FIG. 7A, the output data values generated by the sense circuitry 714 coupled to BL1 and BL2 might be combined (e.g., summed) to generate a single value to be transferred to the word line register 710 An effect of combining the output data values of more than one bit line may be a reduction in saturation (e.g., current saturation) of currents sensed on bit lines. Thus, an increase in sensing resolution and/or sensitivity might be realized by neuron models comprising more than one bit line and subsequently combining the results of the sense operations performed on the two or more bit lines of the neuron models.

Word line drivers, such as those described with respect to FIG. 7A-7B, are configured to facilitate various memory device operations, such as sense (e.g., read), write and erase operations. The word line drivers 712 are configured to apply particular potentials to particular word lines responsive to data latched in the word line data registers 710. The data stored in the word line data register corresponding to a particular word line might indicate one or more of a sense (e.g., read) potential, programming (e.g., write) potential and/or erase potential that is to be applied to the particular word line. A voltage supply Vs 742 might provide sixteen different voltages, although various embodiments according to the present disclosure are not limited to sixteen voltages. The word line drivers 712 can be configured to selectively apply any of the sixteen available voltages where each available voltage is represented by a four bit data value (e.g., '0000'-'1111') which is stored in the word line register 710 location associated with the particular word line driver, for example.

Data corresponding to word line potentials to be applied to particular word lines which is stored in the word line data register 710 might be changed during the execution of a particular memory device operation thereby facilitating applied word line voltages that vary over at least a portion of a duration of the particular memory device operation. For example, these time varying voltages might comprise an increasing or decreasing potential (e.g., stepwise increasing potential and/or stepwise decreasing potential) on one or more word lines during the particular memory device operation. The word line drivers 712 may be further configured to apply one or more time varying voltages on corresponding word lines while concurrently maintaining steady state voltages on one or more different word lines, for example. An example of a steady state potential which might be applied during a read operation might comprise a potential that when applied to memory cells (e.g., unselected memory cells), those memory cells are activated (e.g., exhibit a conductive state) regardless of their data state (e.g., as represented by a programmed threshold voltage) of the memory cells. These potentials facilitate operating one or more unselected memory cells in a pass-through mode.

Figure 9:
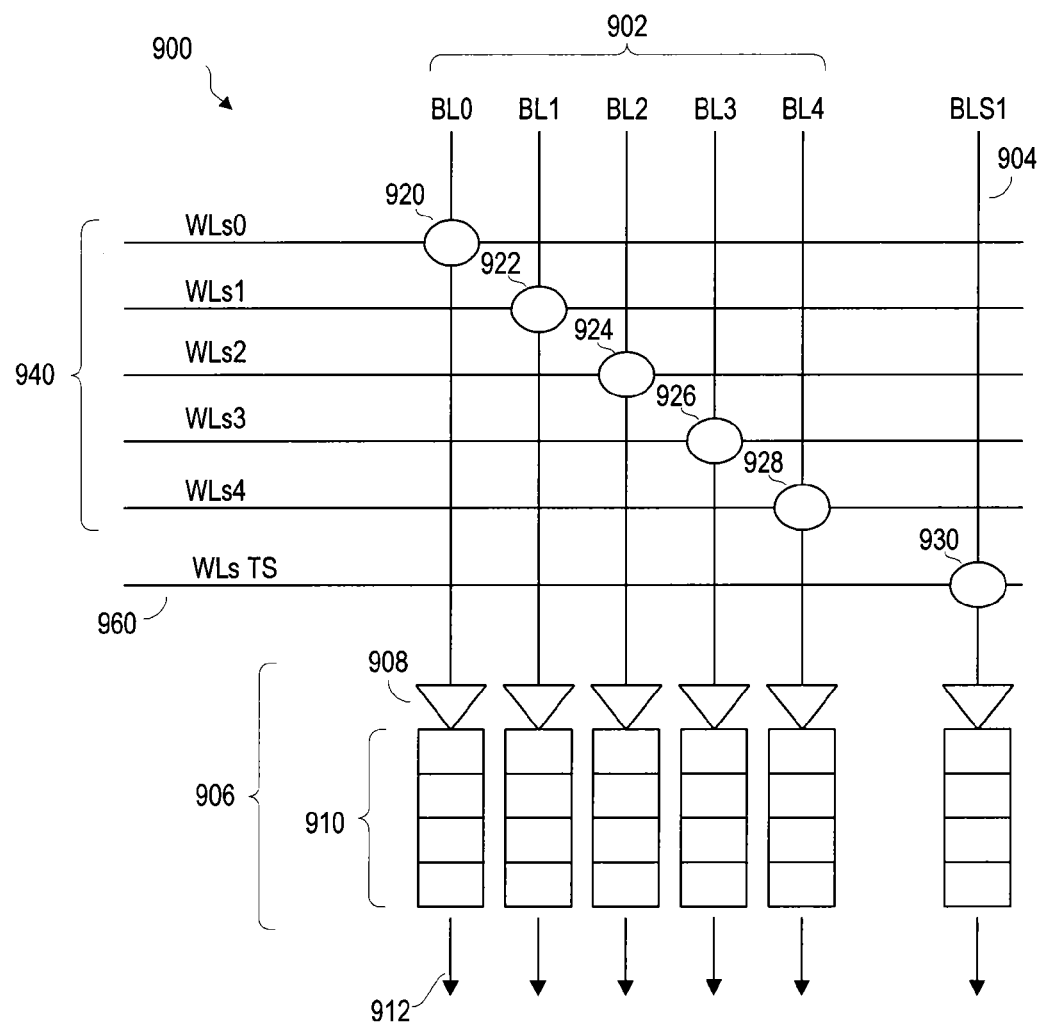
FIG. 9 illustrates a graphical representation of a portion of a memory device configured to facilitate neural network operations according to an embodiment of the present disclosure.

FIG. 9 illustrates a simplified diagram of a neuron model according to one or more embodiments of the present disclosure. By way of example, FIG. 9 illustrates five bit lines BL0-BL4 902. FIG. 9 further illustrates an additional bit line BLS1 904. Each bit line shown in FIG. 9 902, 904 is coupled to sense circuitry 906, such as sense circuitry 714 discussed above with respect to FIG. 7A, for example. The sense circuitry 906 coupled to each bit line comprises a signal conditioning circuitry portion 908 and a register portion 910 configured to latch one or more bits of data representative of a sensed current or voltage on the coupled bit line 902, for example.

Each oval region 920-928 shown in FIG. 9 is representative of a portion of a particular neuron model. For example, oval 920 might comprise one or more strings of memory cells coupled to its corresponding bit line (e.g., bit line BL0 passing through the oval 920 as shown.) According to various embodiments, at least one memory cell from each string of memory cells comprising each oval are concurrently biased during a sense operation performed on the particular portion of the neuron model, such as described above with respect to FIG. 7A, for example. The oval 930 might comprise one or more strings of memory cells (not shown) coupled to the corresponding bit line BLS1 904.

Memory cells comprising oval 930 might be programmed to a data state representative of a threshold level for one or more corresponding neuron models. Each memory cell comprising the oval 930 might be programmed to the same or different data states according to various embodiments of the present disclosure. For example, during a sense operation of a first neuron model, a first memory cell of a string of memory cells comprising the oval 930 and corresponding to the first neuron model might be sensed to determine its data state. The data state determined from the first memory cell of oval 930 might be representative of the overall threshold level of the first neuron model. During a sense operation of a second neuron model, a second memory cell of a string of memory cells comprising the oval 930 and corresponding to the second neuron model might be sensed to determine its data state. The data state determined from the second memory cell of oval 930 might be representative of the overall threshold level of the second neuron model, and so on. The number of data states that memory cells comprising the oval 930 can be programmed to might be the same or might be different than the number of data states that memory cells comprising ovals 920-928 can be programmed to according to one or more embodiments of the present disclosure, for example.

Although shown as single lines to improve readability of the figure, the word lines WLs0-WLs4 940 and WLsTS 960 intersecting each oval 920-930 are each representative of multiple word lines (e.g., word line groups) coupled to the one or more strings of memory cells comprising the portions of neuron models comprising each oval. For example, WLs0 shown in FIG. 9 might be representative of word lines 420 and 422 shown in FIG. 4, for example.

A sense operation according to various embodiments of the present disclosure can be described by way of reference to FIG. 9. The various inputs signals (e.g., such as inputs to a particular neuron model, such as inputs indicated at 832 shown in FIG. 8) can be applied to each word line of each word line group WLs0-WLs4 940 which is coupled to selected memory cells of strings of memory cells comprising each oval 920-928. Remaining word lines of the word line groups 940 coupled to unselected memory cells might be biased with a pass (e.g., Vpass) voltage, for example. Word line group WLsTS 960 might be biased so as to perform a sense operation on a memory cell of a string of memory cells comprising oval 930 in order to determine a particular threshold level for the present neuron model being stimulated. The input signals applied to word line groups 940 and 960 might have been supplied by an input stage 804 of the neural network and shown at 832 of FIG. 8, for example. Alternatively, the input signals applied to these word line groups 940, 960 may have been supplied as outputs from a previous level of the neural network, such as indicated by 834 shown in FIG. 8, for example.

During the sense operation, data values indicative of a current or voltage sensed on the bit lines BL0-BL4 and BLS1 are latched in the registers 910 of the sense circuitry 906 coupled to each bit line. The latched data can be transferred 912 from the registers 910 to additional circuitry (not shown) of the memory device. The transferred data can also be transferred to circuitry, such as word line registers and word line drivers (not shown in FIG. 9) of the memory device to facilitate generating inputs (e.g., input signals) to stimulate neuron models comprising additional levels of the neural network, such as inputs indicated at 834 shown in FIG. 8, for example. Additional processing of the data transferred 912 from the registers 910 might be performed by the control circuitry prior to generating and applying input signals to different neuron models of the neural network. Data transferred from the latches 910 may be transferred from the neural network as neural network output values such as indicated as the output stage 812 shown in FIG. 8, for example. Data latched in the sense circuitry registers 810 might be transferred in a serial or a parallel fashion according to various embodiments of the present disclosure.

Figure 10:
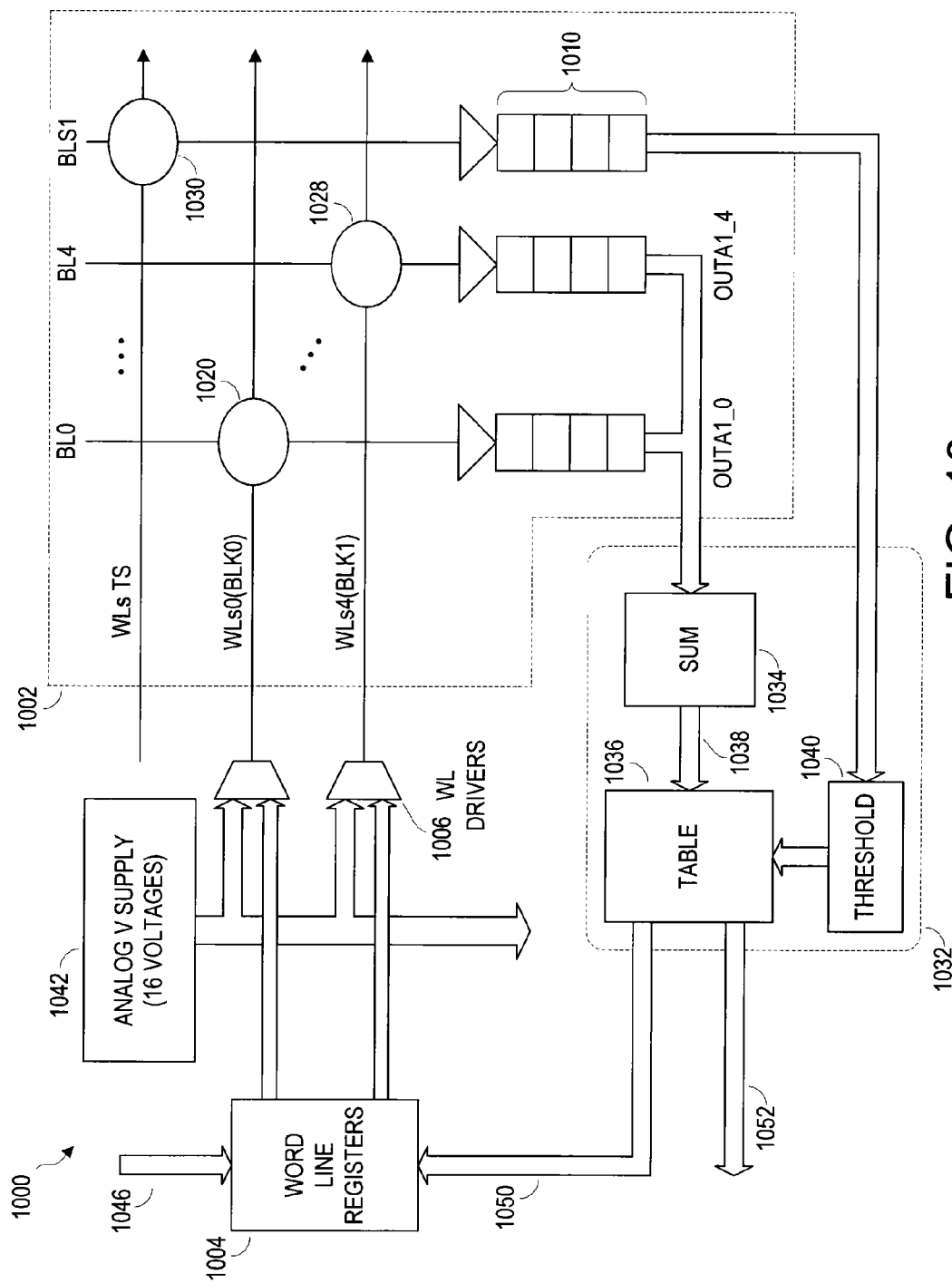
FIG. 10 illustrates a graphical representation of a portion of a memory device configured to facilitate neural network operations according to an embodiment of the present disclosure.

FIG. 10 illustrates a portion of a memory device 1000 according to various embodiments of the present disclosure. The region indicated by dashed lines 1002 might comprise the portion of a memory device such as discussed above and shown in FIG. 9. Ovals 1020, 1028 and 1030 shown in FIG. 10 might correspond to ovals 920, 928 and 930 shown in FIG. 9 respectively, for example. An example of stimulating and sensing a particular neuron model according to one or more embodiments of the present disclosure can be described by way of reference to FIG. 10.

FIG. 10 further illustrates word line register 1004, word line drivers 1006 and a voltage supply 1042, such as similarly described above with respect to FIG. 7A, for example. FIG. 10 further illustrates a bi-directional communications bus 1046 coupled to the word line register 1004. The communications bus 1046 facilitates receiving input values, such as initial input values 832 from input stage 804 shown in FIG. 8, for example. FIG. 10 further illustrates control circuitry 1032 to facilitate operation of the neural network according to one or more embodiments of the present disclosure. Although shown separately, word line registers 1004, word line drivers 1006 and/or control circuitry 1032 can individually, in combination, or in combination with other elements, form a controller (e.g., internal controller) according to one or more embodiments of the present disclosure. Control circuitry 1032 can comprise registers and logic circuitry 1034 which performs one or more operations on data received from the sense circuitry registers 1010, such as data latched during a sense operation, for example. The one or more operations might comprise addition, subtraction, multiplication and/or division operations which can be performed on data received (e.g., transferred) from each sense circuitry register 1010.

Control circuitry 1032 further comprises additional logic circuitry 1036 such as to facilitate a comparison operation of one or more data values generated during sensing, such as those combined together to generate a single data value 1038 for a sense operation performed on a particular neuron model. For example, a single data value 1038 (e.g., summed value) generated as a result of adding currents sensed on bit lines BL0-BL4 might be compared to a data value 1040. The data value 1040 might comprise the threshold level of the particular neuron model. The threshold level of the particular neuron model might be determined by sensing the data state of a memory cell of the oval 1030 which corresponds to the particular neuron model, such as determining a neuron model threshold level from a memory cell of the oval 930 as discussed above with respect to FIG. 9, for example. The control circuitry 1032 might perform a comparison operation to determine if the summed data values from the data registers coupled to ovals 1020, 1028 are equal to or greater than the threshold level of the particular neuron model.

Control circuitry 1032 might be configured to access an operating characteristic table which defines particular operating characteristics for one or more neuron models and/or the complete neural network. The operating characteristic table might be stored in non-volatile memory of the memory device. The operating characteristic table can be retrieved from the non-volatile memory, such as following a reset operation of the memory device, and be loaded into additional memory (e.g., RAM) (not shown) within the control circuitry 1032. The operating characteristics table might comprise a range of input data values and corresponding range of output data values. The operating characteristic table might facilitate a particular function where the summed value (e.g., summed value of currents sensed in bit lines BL0-BL4) 1038 comprises an input value to the particular function and the output of the particular function comprises the output (e.g., output data value) 1050. The data value (e.g., threshold level) 1040 may also comprise an input variable to the particular function. According to various embodiments, the particular function might comprise one or more linear and/or non-linear functions. For example, the operating characteristics table might facilitate a sigmoid function discussed above. Thus, the control circuitry 1032 can translate an input value (e.g., summed data value 1038) to a corresponding output value (e.g., output 1050) based on the contents of the operating characteristics table.

The operating characteristics table might facilitate a threshold function (e.g., comparator function) where the output data value 1050 comprises a first value when the input (e.g., summed data value 1038) is below a particular threshold level corresponding to the neuron model. When the input to the table is equal to or above the particular threshold level, the output data value comprises a second value, such as facilitating a step function, for example.

The output value 1050 may be transferred to word line registers 1004 as inputs for stimulating another neuron model such as in another level of the neural network, for example. The output value might be transferred 1052 to additional circuitry and/or out of the memory device, such as to a memory access device (e.g., processor) coupled to the memory device, for example.

Figure 11:
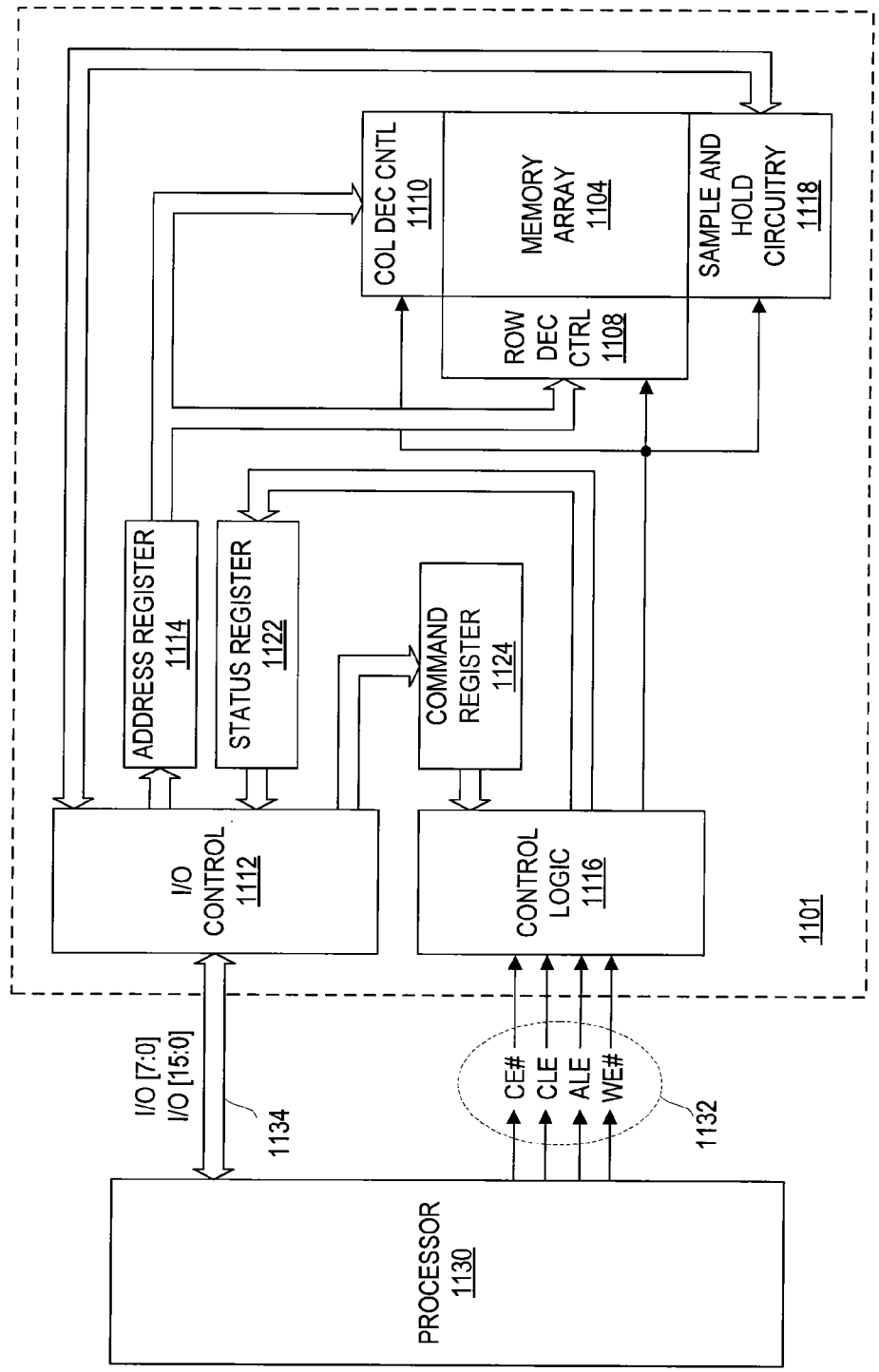
FIG. 11 illustrates a simplified block diagram of a memory device coupled to a memory access device as part of an electronic system according to an embodiment of the present disclosure.

FIG. 11 is a simplified block diagram of an electronic system having a memory access device (e.g., processor) 1130 coupled to a memory device 1101 according to an embodiment of the disclosure, and on which various embodiments of the present disclosure can be practiced. Memory device 1101 includes an array of memory cells 1104 arranged in rows and columns. Although the various embodiments have been described primarily with reference to NAND memory arrays, the various embodiments are not limited to a specific architecture of the memory array 1104. Some examples of other array architectures suitable for the present embodiments include NOR arrays, AND arrays, and virtual ground arrays. In general, however, the embodiments described herein are adaptable to any array architecture permitting generation of a data signal indicative of the data state of each memory cell.

Row decode and control circuitry 1108 and a column decode and control circuitry 1110 are provided to decode address signals provided to the memory device 1101. Address signals are received and decoded to access memory array 1104. Row decode and control circuitry 1108 further facilitates biasing word lines according to various embodiments of the present disclosure. Row decode and control circuitry 1108 might comprise word line registers, word line drivers and voltage supply circuitry described above, for example.

Memory device 1101 also includes input/output (I/O) control circuitry 1112 to manage input of commands, addresses and data to the memory device 1101 as well as output of data and status information from the memory device 1101. An address register 1114 is coupled between I/O control circuitry 1112 and row decode and control circuitry 1108 and column decode and control circuitry 1110 to latch the address signals prior to decoding. A command register 1124 is coupled between I/O control circuitry 1112 and control logic 1116 to latch incoming commands. Control logic 1116 controls access to the memory array 1104 in response to the commands and generates status information for the external processor 1130. The control logic 1116 is coupled to row decode control circuitry 1108 and column decode control circuitry 1110 to control the row decode control circuitry 1108 and column decode control circuitry 1110 in response to the addresses.

Control logic 1116 can be coupled to a sample and hold circuitry 1118. The sample and hold circuitry 1118 latches data, either incoming or outgoing, in the form of analog data signals. The sample and hold circuitry 1118 can comprise the sensing circuitry and registers comprising the sense circuitry coupled to bit lines as described above with respect to one or more embodiments of the present disclosure, for example.

The sample and hold circuitry 1118 could contain capacitors or other analog storage devices for sampling either an incoming data signal representing data to be written to a memory cell or an outgoing data signal indicative of the threshold voltage sensed from a memory cell. The sample and hold circuitry 1118 may further provide for amplification and/or buffering of the sampled signal to provide a stronger data signal to an external device. It is noted that the sample and hold circuitry 1118 could include analog-to-digital conversion functionality and digital-to-analog conversion (DAC) functionality to convert read data from an analog data signal to a digital bit pattern and to convert write data from a digital bit pattern to an analog signal, such as part of sense operations and/or word line potential generation according to various embodiments the present disclosure.

According to various embodiments of the present disclosure, control logic 1116, control circuitry 1112 and/or firmware or other circuitry (e.g., any or all of 1114, 1122, 1124, 1110, and 1108) can individually, in combination, or in combination with other elements, form an internal controller. Control logic 1116 is one example of control circuitry, such as control circuitry 1032 discussed above with respect to FIG. 10. As used herein, however, a controller need not necessarily include any or all of such components. In some embodiments, a controller can comprise an internal controller (e.g., located on the same die as the memory array) and/or an external controller, for example.

During a write operation, target memory cells of the memory array 1104 can be programmed until voltages indicative of their Vt levels match the levels held in the sample and hold circuitry 1118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired threshold value. In a sense operation, the Vt levels of the target memory cells are passed to the sample and hold circuitry 1118 for transfer to an external processor (not shown in FIG. 11) either directly as analog signals or as digitized representations of the analog signals depending upon whether ADC/DAC functionality is provided external to, or within, the memory device.

Threshold voltages of memory cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 1118 may include caching, i.e., multiple storage locations for each data value, such that the memory device 1101 may be reading a next data value while passing a first data value to an external processor, or receiving a next data value while writing a first data value to the memory array 1104. A status register 1122 is coupled between I/O control circuitry 1112 and control logic 1116 to latch the status information for output to the external processor.

Memory device 1101 receives control signals at control logic 1116 over a control link 1132. The control signals may include a chip enable CE#, a command latch enable CLE, an address latch enable ALE, and a write enable WE#. Memory device 1101 may receive commands (in the form of command signals), addresses (in the form of address signals), and data (in the form of data signals) from the processor over a multiplexed input/output (I/O) bus 1134 and output data to the external processor over I/O bus 1134.

In a specific example, commands are received over input/output (I/O) pins [7:0] of I/O bus 1134 at I/O control circuitry 1112 and are written into command register 1124. The addresses are received over input/output (I/O) pins [7:0] of bus 1134 at I/O control circuitry 1112 and are written into address register 1114. The data may be received over input/output (I/O) pins [7:0] for a device capable of receiving eight parallel signals, or input/output (I/O) pins [15:0] for a device capable of receiving sixteen parallel signals, at I/O control circuitry 1112 and are transferred to sample and hold circuitry 1118. Data also may be output over input/output (I/O) pins [7:0] for a device capable of transmitting eight parallel signals or input/output (I/O) pins [15:0] for a device capable of transmitting sixteen parallel signals. The control link 1132 and the I/O bus 1134 might be combined or might be combined in part to form a communications channel between the processor 1130 and the memory device 1101. It will be appreciated by those skilled in the art that additional circuitry and signals can be provided, and that the memory device of FIG. 11 has been simplified to help focus on the embodiments of the present disclosure.

While the memory device of FIG. 11 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 1134. Because the data signals represent bit patterns instead of individual bits, serial communication of an 8-bit data signal could be as efficient as parallel communication of eight signals representing individual bits, for example.

CONCLUSION

Methods of facilitating neural network operations in memories, and memories using the methods have been described. In particular, some embodiments facilitate concurrently stimulating one or more memory cells where the one or more memory cells comprise a neuron model. Neuron models can be operated concurrently to be responsive to inputs and generate outputs. Additional embodiments facilitate operating neural networks within a memory device where the neural networks can comprise multiple levels of neuron models. Outputs generated by neuron models of a particular level of the neural network can be supplied as inputs to a different level of neuron models of the neural network thus facilitating a feed-ward type neural network, for example. Methods of establishing operating characteristics of neural networks according to various embodiments have also been described.

Although specific embodiments have been illustrated and described herein, it will be appreciated by those of ordinary skill in the art that any arrangement, which is calculated to achieve the same purpose, may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory device, the method comprising:
applying a first potential to a control gate of a first memory cell of a string of series-connected memory cells connected to a data line while activating each remaining memory cell of the string of series-connected memory cells;
generating a first output responsive to sensing the data line a first time while applying the first potential to the control gate of the first memory cell and while each remaining memory cell of the string of series-connected memory cells is activated;
applying a second potential to a control gate of a second memory cell of the string of series-connected memory cells while activating each remaining memory cell of the string of series-connected memory cells, wherein the second potential is generated as a function of the first output; and
sensing the data line a second time while applying the second potential to the control gate of the second memory cell and while each remaining memory cell of the string of series-connected memory cells is activated.

2. The method of claim 1, further comprising generating a second output responsive to sensing the data line the second time while applying the second potential to the control gate of the second memory cell and while each remaining memory cell of the string of series-connected memory cells is activated.

3. The method of claim 2, further comprising transferring the second output from the memory device.

4. The method of claim 1, further comprising:
applying a third potential to a control gate of a third memory cell of the string of series-connected memory cells while activating each remaining memory cell of the string of series-connected memory cells, wherein the third potential is generated as a function of the second output; and
sensing the data line a third time while applying the third potential to the control gate of the third memory cell and while each remaining memory cell of the string of series-connected memory cells is activated.

5. The method of claim 1, wherein the first potential comprises an input potential generated responsive to an input received at an interface of the memory device.

6. The method of claim 1, further comprising performing a programming operation on one or more memory cells of the string of series-connected memory cells prior to applying the first potential to the control gate of the first memory cell.

7. The method of claim 6, wherein performing the programming operation comprises adjusting a threshold voltage of one or more memory cells of the string of series-connected memory cells.

8. The method of claim 6, wherein performing the programming operation further comprises programming the one or more memory cells of the string of series-connected memory cells as SLC memory cells or MLC memory cells.

9. The method of claim 1, wherein sensing the data line the first time and sensing the data line the second time each comprise sensing a current on the data line while the first potential and the second potential are applied, respectively.

10. The method of claim 1, wherein sensing the data line the first time and sensing the data line the second time each comprises sensing a voltage on the data line while the first potential and the second potential are applied, respectively.

11. The method of claim 1, wherein the second potential comprises a logic high potential when the first output is greater than or equal to a particular threshold level, and wherein the second potential comprises a logic low potential when the first output is less than the particular threshold level.

12. A method of operating a memory device, the method comprising:
applying a first potential to a control gate of a first memory cell of a string of series-connected memory cells connected to a first data line and to a control gate of a first memory cell of a string of series-connected memory cells connected to a second data line while activating each remaining memory cell of the string of series-connected memory cells connected to the first data and each remaining memory cell of the string of series-connected memory cells connected to the second data line;
generating first and second outputs responsive to sensing the first and second data lines a first time while applying the first potential to the control gate of the first memory cell of the string of series-connected memory cells connected to the first data line and to the control gate of the first memory cell of the string of series-connected memory cells connected to the second data line, and while each remaining memory cell of the string of series-connected memory cells connected to the first data line and each remaining memory cell of the string of series-connected memory cells connected to the second data line is activated;
applying a second potential to a second memory cell of the string of series-connected memory cells connected to the first data line and to a second memory cell of the string of series-connected memory cells connected to the second data line while activating each remaining memory cell of the string of series-connected memory cells connected to the first data and each remaining memory cell of the string of series-connected memory cells connected to the second data line, wherein the second potential is generated as a function of at least one of the first and second outputs; and
generating third and fourth outputs responsive to sensing the first and second data lines a second time while applying the second potential to the control gate of the second memory cell of the string of series-connected memory cells connected to the first data line and to the control gate of the second memory cell of the string of series-connected memory cells connected to the second data line, and while each remaining memory cell of the string of series-connected memory cells connected to the first data line and each remaining memory cell of the string of series-connected memory cells connected to the second data line is activated.

13. The method of claim 12, further comprising:
applying a third potential to a control gate of a third memory cell of the string of series-connected memory cells connected to the first data line and to control gate of a third memory cell of the string of series-connected memory cells connected to the second data line while activating each remaining memory cell of the string of series-connected memory cells connected to the first data and each remaining memory cell of the string of series-connected memory cells connected to the second data line, wherein the third potential is generated as a function of at least one of the third and fourth outputs; and generating fifth and sixth outputs responsive to sensing the first and second data lines a third time while applying the third potential to the control gate of the third memory cell of the string of series-connected memory cells connected to the first data line and to the control gate of the third memory cell of the string of series-connected memory cells connected to the second data line, and while each remaining memory cell of the string of series-connected memory cells connected to the first data line and each remaining memory cell of the string of series-connected memory cells connected to the second data line is activated.

14. The method of claim 13, further comprising:
applying a fourth potential to a fourth memory cell of the string of series-connected memory cells connected to the first data line and to a fourth memory cell of the string of series-connected memory cells connected to the second data line while activating each remaining memory cell of the string of series-connected memory cells connected to the first data and each remaining memory cell of the string of series-connected memory cells connected to the second data line, wherein the fourth potential is generated as a function of at least one of the fifth and sixth outputs; and generating seventh and eighth outputs responsive to sensing the first and second data lines a fourth time while applying the fourth potential to the control gate of the fourth memory cell of the string of series-connected memory cells connected to the first data line and to the control gate of the fourth memory cell of the string of series-connected memory cells connected to the second data line, and while each remaining memory cell of the string of series-connected memory cells connected to the first data line and each remaining memory cell of the string of series-connected memory cells connected to the second data line is activated.

15. The method of claim 12, further comprising programming one or more memory cells of the strings of series-connected memory cells to one of a plurality of data states prior to applying the first potential to the control gate of the first memory cell of the string of series-connected memory cells connected to the first data line and to the control gate of the first memory cell of the string of series-connected memory cells connected to the second data line.

16. A method of operating a memory device, the method comprising:
applying a first potential to a control gate of a first memory cell of a first string of series-connected memory cells connected to a first data line while activating each remaining memory cell of the first string of series-connected memory cells;
performing a first sense operation on the first data line responsive to applying the first potential to the control gate of the first memory cell of the first string of series-connected memory cells;
generating a second potential, wherein the second potential comprises a potential level generated as a function of a first level sensed on the first data line during the first sense operation;
applying the second potential to a control gate of a first memory cell of a second string of series-connected memory cells connected to a second data line while activating each remaining memory cell of the second string of series-connected memory cells; and performing a second sense operation on the second data line responsive to applying the second potential to the control gate of the first memory cell of the second string of series-connected memory cells.

17. The method of claim 16, further comprising:
generating a third potential, wherein the third potential comprises a potential level generated as a function of a second level sensed on the second data line during the second sense operation;
applying the third potential to a control gate of a second memory cell of the first string of series-connected memory cells connected to the first data line while activating each remaining memory cell of the first string of series-connected memory cells; and
performing a third sense operation on the first data line responsive to applying the third potential to the control gate of the second memory cell of the first string of series-connected memory cells.

18. The method of claim 17, further comprising:
generating a fourth potential, wherein the fourth potential comprises a potential level generated as a function of a third level sensed on the first data line during the third sense operation;
applying the fourth potential to a control gate of a second memory cell of the second string of series-connected memory cells connected to the second data line while activating each remaining memory cell of the second string of series-connected memory cells; and
performing a fourth sense operation on the second data line responsive to applying the fourth potential to the control gate of the second memory cell of the second string of series-connected memory cells.

19. The method of claim 16, wherein generating the second potential as a function of the first level sensed further comprises generating the second potential as a function of the first level sensed by accessing a table corresponding to the function, wherein an input to the table comprises the first level sensed and an output of the table comprises a value of the second potential to be generated.

20. The method of claim 19, further comprising storing the table in one or more memory locations of the memory device prior to generating the second potential.

21. The method of claim 20, wherein storing the table in the one or more memory locations further comprises storing the table where the one or more memory locations comprise volatile and/or non-volatile memory locations in the memory device.

22. A method of operating a memory device, the method comprising:
applying a first potential to a first access line coupled to a first memory cell of a first string of series-connected memory cells and to a first memory cell of a second string of series-connected memory cells while activating each remaining memory cell of the first string of series-connected memory cells and each remaining memory cell of the second string of series-connected memory cells, wherein the first string of series-connected memory cells is connected to a first data line and where the second string of series-connected memory cells is connected to a second data line;
applying a second potential to a second access line coupled to a first memory cell of a third string of series-connected memory cells and to a first memory cell of a fourth string of series-connected memory cells while activating each remaining memory cell of the third string of series-connected memory cells and each remaining memory cell of the fourth string of series-connected memory cells, wherein the third string of series-connected memory cells is connected to the first data line and where the fourth string of series-connected memory cells is connected to the second data line;

concurrently sensing the first data line and the second data line while applying the first potential and the second potential; and generating a single output for a neuron model responsive to concurrently sensing the first and the second data lines.

23. The method of claim 22, wherein generating the single output further comprises generating the single output by adding current data corresponding to a current sensed on the first data line to current data corresponding to a current sensed on the second data line.

24. A method of operating a memory device as a neural network, the method comprising:

performing a first sense operation on a first plurality of memory cells connected to a first data line and comprising a first neuron model, and generating a first output, wherein each memory cell of the first plurality of memory cells is contained in a different string of series-connected memory cells of a first plurality of strings of series-connected memory cells and wherein each memory cell of the first plurality of strings of series-connected memory cells other than the first plurality of memory cells is activated while performing the first sense operation;

performing a second sense operation on a second plurality of memory cells connected to a second data line and comprising a second neuron model, and generating a second output, wherein each memory cell of the second plurality of memory cells is contained in a different string of series-connected memory cells of a second plurality of strings of series-connected memory cells and wherein each memory cell of the second plurality of strings of series-connected memory cells other than the second plurality of memory cells is activated while performing the second sense operation;

performing a third sense operation on a third plurality of memory cells connected to the first data line and comprising a third neuron model, wherein each memory cell of the third plurality of memory cells is contained in a different string of series-connected memory cells of the first plurality of strings of series-connected memory cells and wherein each memory cell of the first plurality of strings of series-connected memory cells other than the third plurality of memory cells is activated while performing the third sense operation; and performing a fourth sense operation on a fourth plurality of memory cells connected to the second data line and comprising a fourth neuron model, wherein each memory cell of the fourth plurality of memory cells is contained in a different string of series-connected memory cells of the second plurality of strings of series-connected memory cells and wherein each memory cell of the second plurality of strings of series-connected memory cells other than the fourth plurality of memory cells is activated while performing the fourth sense operation;

wherein the third sense operation is performed by applying a first and a second potential to the third neuron model where the first potential and the second potential are generated as a function of the first output and the second output; and wherein the fourth sense operation is performed by applying the first and the second potential to the fourth neuron model where the fourth sense operation is performed concurrently with the third sense operation.

25. A memory device, comprising:

a string of series-connected memory cells selectively connected to a data line; and a controller, wherein the controller is configured to apply a first potential to a control gate of a first memory cell of the string of series-connected memory cells during a first sense operation on the data line while activating each remaining memory cell of the string of series-connected memory cells and while the string of series-connected memory cells is connected to the data line, and to apply a second potential to a control gate of a second memory cell of the string of series-connected memory cells during a second sense operation on the data line while activating each remaining memory cell of the string of series-connected memory cells and while the string of series-connected memory cells is connected to the data line, wherein the second potential comprises a potential generated as a function of an output generated responsive to sensing the data line during the first sense operation.

26. The memory device of claim 25, wherein the controller is further configured to apply a third potential to a control gate of a third memory cell of the series-connected string of memory cells during a third sense operation on the data line while activating each remaining memory cell of the string of series-connected memory cells and while the string of series-connected memory cells is connected to the data line, wherein the third potential is generated as a function of an output generated responsive to sensing the data line during the second sense operation.

27. The memory device of claim 26, wherein the controller is further configured to apply a fourth potential to a control gate of a fourth memory cell of the string of series-connected memory cells during a fourth sense operation on the data line while activating each remaining memory cell of the string of series-connected memory cells and while the string of series-connected memory cells is connected to the data line, wherein the fourth potential is generated as a function of an output generated responsive to sensing the data line during the third sense operation.

28. The memory device of claim 25, wherein the string of series-connected memory cells comprise charge storage memory cells.

29. The memory device of claim 25, wherein the string of series-connected memory cells comprise NAND configured strings of memory cells.

30. The memory device of claim 25, further comprising sense circuitry configured to sense a current on the data line during the sense operations.

31. The memory device of claim 30, wherein the generated output comprises a data value corresponding to a current sensed on the data line during the first sense operation.

32. The memory device of claim 31, wherein the second potential is generated as a function of the current sensed on the data line during the first sense operation.

33. The memory device of claim 32, wherein the function comprises one of a linear function or a non-linear function.

34. The memory device of claim 32, wherein the function comprises a sigmoid function.

35. The memory device of claim 32, wherein the function comprises a threshold function.

36. The memory device of claim 25, wherein the second potential is generated responsive to accessing a table.

37. The memory device of claim 25, wherein the controller is further configured to perform a program operation on one or more memory cells of the string of series-connected memory cells.

38. The memory device of claim 25, further comprising signal conditioning circuitry coupled to the data line.

39. The memory device of claim 25, further comprising one or more registers coupled to the data line.

40. The memory device of claim 25, wherein the controller comprises one or more access line drivers.

41. The memory device of claim 25, wherein the controller comprises one or more access line registers.

42. A system, comprising:
a communications channel;
a memory access device coupled to the communications channel and configured to generate memory device commands; and
a memory device coupled to the communications channel and configured to be responsive to the memory device commands, the memory device comprising:
  a string of series-connected memory cells selectively connected to a data line; and
  a controller, wherein the controller is configured to:
    apply a first potential to a control gate of a first memory cell of the string of series-connected memory cells during a first sense operation on the data line while activating each remaining memory cell of the string of series-connected memory cells and while the string of series-connected memory cells is connected to the data line; and
    apply a second potential to a control gate of a second memory cell of the string of series-connected memory cells during a second sense operation on the data line while activating each remaining memory cell of the string of series-connected memory cells and while the string of series-connected memory cells is connected to the data line, wherein the second potential comprises a potential generated as a function of an output generated responsive to sensing the data line during the first sense operation.

43. A memory device, comprising:
an array of memory cells comprising a plurality of NAND configured strings of series-connected memory cells; and
a controller, wherein the controller is configured to operate at least a portion of the array of memory cells as a neural network;
wherein the controller is further configured to operate a first plurality of memory cells of the array of memory cells as a first neuron model, wherein the first plurality of memory cells comprises at least two memory cells selectively connected to a particular data line, and wherein each of the at least two memory cells are contained in a different NAND configured string of series-connected memory cells each selectively connected to the particular data line; and
wherein the controller is further configured to sense the particular data line while each of the at least two memory cells receives a respective potential at its control gate to selectively activate that memory cell of the at least two memory cells depending upon its data state, and while each remaining memory cell of the different NAND configured strings of series-connected memory cells containing a respective one of the at least two memory cells is activated, and while the particular data line is connected to each of the different NAND configured strings of series-connected memory cells containing a respective one of the at least two memory cells.

44. The memory device of claim 43, wherein the controller is further configured to accept an initial input and apply the initial input to the control gates of the first plurality of memory cells and operate the first plurality of memory cells as the first neuron model responsive to the applied initial input.

45. The memory device of claim 43, wherein the controller is further configured to generate a first output responsive to operating the first plurality of memory cells as the first neuron model.

46. The memory device of claim 45, wherein the controller is further configured to operate a second plurality of memory cells of the array of memory cells as a second neuron model.

47. The memory device of claim 46, wherein the controller is further configured to operate the second plurality of memory cells as the second neuron model responsive to the generated first output.

48. The memory device of claim 47, wherein the controller is further configured to apply the generated first output to control gates of the second plurality of memory cells and to operate the second plurality of memory cells as the second neuron model responsive to the applied first output.

49. The memory device of claim 48, wherein the controller is further configured to generate a second output responsive to operating the second plurality of memory cells as the second neuron model.

50. The memory device of claim 49, wherein the second output comprises an output of the neural network.

51. The memory device of claim 49, wherein the first neuron model and the second neuron model comprise the neural network.

52. The memory device of claim 51, wherein the neural network comprises a feed-ward neural network.

53. The memory device of claim 46, wherein the second plurality of memory cells comprises at least two memory cells selectively connected to the particular data line, and wherein each of these at least two memory cells are contained in a different NAND configured string of series-connected memory cells.

54. The memory device of claim 46, wherein the second plurality of memory cells comprises at least two memory cells selectively connected to a different data line, and wherein the second plurality of memory cells are connected to receive a same set of inputs as the first plurality of memory cells.

55. A method of operating a memory device as a neural network, the method comprising:
stimulating a first plurality of memory cells of an array of memory cells comprising a plurality of strings of series-connected memory cells, wherein the first plurality of memory cells comprise a first neuron model, wherein the first plurality of memory cells comprises at least two memory cells selectively connected to a particular data line, and wherein each of the at least two memory cells are contained in a different string of a plurality of strings of series-connected memory cells;
activating each remaining memory cell of each of the strings of the plurality of strings of series-connected memory cells while stimulating the first plurality of memory cells and while each of the strings of the plurality of strings of series-connected memory cells is connected to the particular data line;

generating a first output responsive to stimulating the first plurality of memory cells while activating the remaining memory cells of the plurality of strings of series-connected memory cells;

stimulating a second plurality of memory cells of the memory cells of the array of memory cells wherein the second plurality of memory cells comprise a second neuron model, wherein the second plurality of memory cells comprises at least two memory cells selectively connected to the particular data line, and wherein each of these at least two memory cells are contained in a different string of the plurality of strings of series-connected memory cells; and activating each remaining memory cell of each of the strings of the plurality of strings of series-connected memory cells while stimulating the second plurality of memory cells and while each of the strings of the plurality of strings of series-connected memory cells is connected to the particular data line;

wherein the second plurality of memory cells are stimulated by applying the first output to the second plurality of memory cells.

56. The method of claim 55, further comprising generating a second output responsive to stimulating the second plurality of memory cells with the first output while activating the remaining memory cells of the plurality of strings of series-connected memory cells.

57. The method of claim 55, further comprising receiving an input and wherein stimulating the first plurality of memory cells further comprises stimulating the first plurality of memory cells by applying the received input to respective control gates of one or more memory cells of the first plurality of memory cells.

58. A method of operating a memory device as a neural network, the method comprising:

stimulating a first neuron model, wherein the first neuron model comprises a first plurality of memory cells of an array of memory cells of the memory device, wherein the first plurality of memory cells comprises at least two memory cells selectively connected to a particular data line, and wherein each of the at least two memory cells are contained in a different string of a plurality of strings of series-connected memory cells of the array of memory cells;

activating each remaining memory cell of each of the strings of the plurality of strings of series-connected memory cells while stimulating the first neuron model and while each of the strings of the plurality of strings of series-connected memory cells is connected to the particular data line;

generating a first output responsive to stimulating the first neuron model while activating the remaining memory cells of the plurality of strings of series-connected memory cells;

stimulating a second neuron model, wherein the second neuron model comprises a second plurality of memory cells of the array of memory cells, wherein the second plurality of memory cells comprises at least two memory cells selectively connected to the particular data line, and wherein each of these at least two memory cells are contained in a different string of the plurality of strings of series-connected memory cells of the array of memory cells; and activating each remaining memory cell of each of the strings of the plurality of strings of series-connected memory cells while stimulating the second neuron model and while each of the strings of the plurality of strings of series-connected memory cells is connected to the particular data line;

wherein the second neuron model is stimulated by applying the first output to the second neuron model.

59. The method of claim 58, wherein stimulating the second neuron model further comprises stimulating the second neuron model by concurrently applying the first output to respective control gates of the second plurality of memory cells.

60. The method of claim 58, further comprising generating a second output responsive to stimulating the second neuron model while activating the remaining memory cells of the plurality of strings of series-connected memory cells.

61. The method of claim 60, further comprising stimulating a third neuron model, wherein the third neuron model comprises a third plurality of memory cells of the array of memory cells, and where the third neuron model is stimulated by applying the second output to the third neuron model.

62. The method of claim 58, further comprising receiving an input prior to stimulating the first neuron model.

63. The method of claim 62, wherein stimulating the first neuron model further comprises stimulating the first neuron model by applying the received input to the first neuron model.

64. The method of claim 58, wherein the first neuron model and the second neuron model comprise the neural network.

65. The method of claim 64, further comprising programming one or more memory cells of the first plurality of memory cells and/or programming one or more memory cells of the second plurality of memory cells to one of a plurality of data states prior to stimulating the first neuron model, wherein the data states of the programmed memory cells define one or more operating characteristics of the neural network.

66. The method of claim 65, further comprising changing one or more programmed data states of one or more memory cells of the first and/or the second plurality of memory cells to change one or more operating characteristics of the neural network.

67. The method of claim 66, wherein changing one or more programmed data states further comprises changing one or more programmed data states by performing a programming operation and/or an erase operation on one or more memory cells of the first and/or the second plurality of memory cells.

* * * * *